US012772805B2

(12) United States Patent
Lin et al.

(10) Patent No.: US 12,772,805 B2
(45) **Date of Patent: *Oct. 20, 2026**

(54) SYSTEMS AND METHODS OF TESTING MEMORY DEVICES

(71) Applicant: Taiwan Semiconductor Manufacturing Company, Ltd., Hsinchu (TW)

(72) Inventors: Meng-Han Lin, Hsinchu City (TW); Chia-En Huang, Xinfeng Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 320 days.

This patent is subject to a terminal disclaimer.

(21) Appl. No.: 18/678,953

(22) Filed: May 30, 2024

(65) Prior Publication Data

US 2024/0312850 A1 Sep. 19, 2024

Related U.S. Application Data

(60) Continuation of application No. 18/232,518, filed on Aug. 10, 2023, now Pat. No. 12,020,996, which is a (Continued)

(51) Int. Cl.

*H10P 74/00* (2026.01)
*H10B 51/20* (2023.01)

(Continued)

(52) U.S. Cl.

CPC ........... *H10P 74/273* (2026.01); *H10B 51/20* (2023.02); *H10B 51/40* (2023.02); *H10P 74/203* (2026.01)

(58) Field of Classification Search

CPC ..... H10P 74/273; H10P 74/203; H10B 51/20; H10B 51/40

See application file for complete search history.

(56) References Cited

U.S. PATENT DOCUMENTS 11,728,227 B1 8/2023 Lin et al.
11,735,238 B2 8/2023 Lai et al.

(Continued)

FOREIGN PATENT DOCUMENTS

CN 112864036 A 5/2021
TW 202133340 A 9/2021

OTHER PUBLICATIONS

Notice of Allowance on U.S. Appl. No. 17/526,774 DTD Aug. 30, 2023.

(Continued)

*Primary Examiner* — Richard A Booth
(74) *Attorney, Agent, or Firm* — Foley & Lardner LLP

(57) ABSTRACT

A memory device includes a first memory block. The first memory block includes a first memory sub-array and a first interface portion disposed next to the first memory sub-array. The first memory block further includes a plurality of first interconnect structures electrically coupled to the first memory sub-array through the first interface portion, and a second plurality of interconnect structures configured to electrically couple a corresponding one of the plurality of first interconnect structures to a transistor. The memory device further includes a first test structure and a second test structure disposed next to the first memory block, each configured to simulate electrical connections of the plurality of second interconnect structures. The first and second test structures are electrically coupled to each other and are each electrically isolated form the first memory block.

20 Claims, 38 Drawing Sheets

Related U.S. Application Data division of application No. 17/526,774, filed on Nov. 15, 2021, now Pat. No. 11,854,914.

(51) Int. Cl.

| | |
|---|---|
| ***H10B 51/40*** | (2023.01) |
| ***H10P 74/20*** | (2026.01) |

(56) References Cited

U.S. PATENT DOCUMENTS

| | | | | |
|---|---|---|---|---|
| 11,735,280 | B2 | 8/2023 | Li et al. | |
| 11,854,914 | B2 * | 12/2023 | Lin ........................ | H10B 43/27 |
| 2020/0036374 | A1 | 1/2020 | Akahane | |
| 2023/0208280 | A1 | 6/2023 | Groiss et al. | |

OTHER PUBLICATIONS

Notice of Allowance on U.S. Appl. No. 18/232,518 DTD Feb. 28, 2024.

Office Action issued in Taiwan Appl. No. 111111502 dated Oct. 22, 2025.

* cited by examiner

SYSTEMS AND METHODS OF TESTING MEMORY DEVICES

CROSS-REFERENCE TO RELATED APPLICATIONS

The present application is a continuation of U.S. patent application Ser. No. 18/232,518, filed Aug. 10, 2023, and titled "SYSTEMS AND METHODS OF TESTING MEMORY DEVICES," which is a divisional of U.S. patent application Ser. No. 17/526,774, now U.S. Pat. No. 11,854, 914, filed Nov. 15, 2021, and titled "SYSTEMS AND METHODS OF TESTING MEMORY DEVICES," the entire disclosures of both of which are incorporated herein by reference for all purposes.

BACKGROUND

A non-volatile memory device retains data stored therein even when not powered. Two-dimensional memory devices in which memory cells are fabricated in a single layer over a substrate have reached physical limits in terms of increasing their degree of integration. Accordingly, three-dimensional (3D) non-volatile memory devices in which memory cells are stacked in a vertical direction over a substrate have been proposed. In general, a 3D (non-volatile) memory device includes a number of memory cells stacked on top of one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
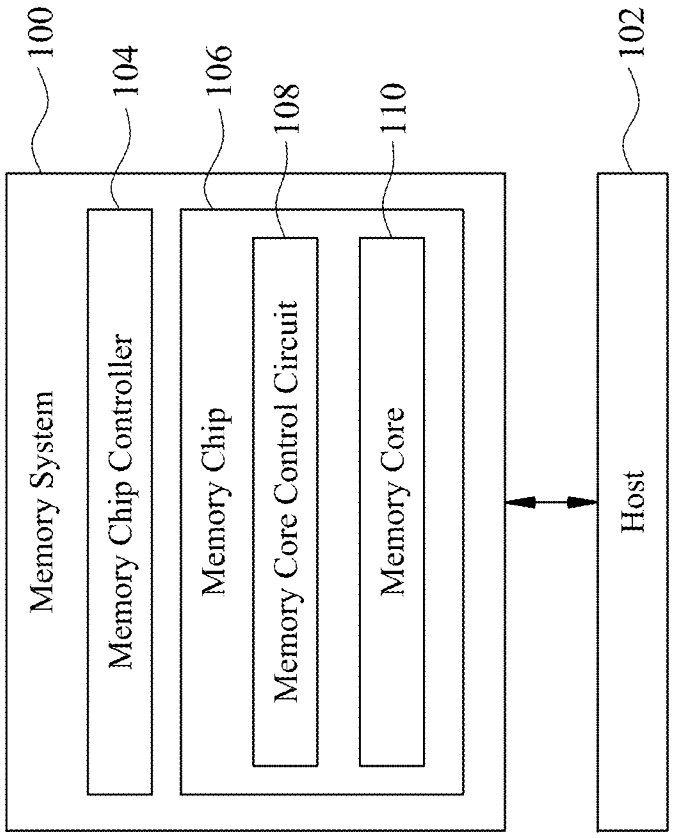
FIG. 1A illustrates a block diagram of a memory system and a host, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a 3D memory device includes a number of memory blocks. Each memory block includes at least one memory array (or sub-array) of memory cells formed in a stack of insulating layers and conductive layers. In general, the conductive layers can function as or be coupled to gates or gate electrodes of the memory cells. Such conductive layers are typically referred to as word lines (WLs) of the memory cells. Over the wafer (or die) in which a memory array is formed, the WLs can laterally extend through the memory array and beyond one or both sides of the memory array, thereby allowing electrical interface with memory cells included in the memory array. Such extending portions of the WLs are sometimes referred to as part of an interface portion of each memory block, which may have a staircase profile. The interface portion, including portions of the WLs, can serve as an electrical interface for the memory block.

For example, the interface portion can further include a number interconnect structure electrically coupling the WLs to one or more driver circuits. Such driver circuits can apply or otherwise provide (e.g., voltage) signals to the WLs so as to "drive" (e.g., turn on/off) the gates of the coupled memory cells. These interconnect structures are typically formed as via structures that vertically penetrate through the memory array. As a density of the memory cells becomes greater by having more layers of WLs vertically stacked on top of one another, an aspect ratio, or the ratio of the height divided by the width, of each of the interconnect structures may become higher accordingly. Thus, it may become increasingly challenging to monitor a yield of forming such interconnect structures. For example, some of the interconnect structures may be formed shorter than expected, which may form an open circuit.

The present disclosure provides various embodiments of systems and methods for testing the interconnect structures of a 3D memory device. For example, while fabricating the 3D memory device including a number of memory blocks (each of which includes a memory sub-array and one or more staircase interface portions), one or more test structures can be concurrently formed next to each of the memory sub-arrays. By concurrently forming the test structures, each test structure can have one or more test staircase interface portions to emulate, mimic, simulate, or otherwise follow the staircase interface portions of a corresponding memory sub-array. Further, while forming interconnect structures in each of the memory sub-arrays to electrically couple the memory sub-array to one or more corresponding driver circuits, each test structure can include a number of test interconnect (via) structures being concurrently formed to emulate, mimic, simulate, or otherwise follow the interconnect structures formed within the memory sub-array. As such, the one or more test via structures can emulate the profiles and dimensions of the interconnect structures of each corresponding memory sub-array.

In various embodiments, those test via structures of each test structure can be electrically coupled to one another in series, thereby allowing any issues of electrical connections related to the interconnect structures in the corresponding memory block to be accurately detected. For example, in response to detecting that the level of a current flowing through the serially coupled test via structures is under a threshold, the disclosed system can determine that there may be an open circuit present along such a conduction path that is constituted by the test via structures, which can in turn determine that there may be an open circuit present in one or more of the interconnect structures in the memory block. Further, the respective test structure(s) of the memory blocks can be electrically coupled to one another in series. As such, the memory block that has problematic electrical connections can be quickly and accurately identified, which will be discussed in further detail below.

FIG. 1A illustrates a block diagram including a memory system 100 and a host 102, in accordance with various embodiments. The memory system 100 may include a non-volatile storage system interfacing with the host 102 (e.g., a mobile computing device). In some embodiments, the memory system 100 may be embedded within the host 102. In some embodiments, the memory system 100 may include a memory card. As shown, the memory system 100 includes a memory chip controller 104 and a memory chip 106. Although a single memory chip 106 is shown, the memory system 100 may include more than one memory chip (e.g., four, eight or some other number of memory chips). The memory chip controller 104 can receive data and commands from the host 102 and provide memory chip data to the host 102.

The memory chip controller 104 may include one or more state machines, page registers, SRAM, and control circuitry for controlling the operation of the memory chip 106. The one or more state machines, page registers, static random access memory (SRAM), and control circuitry for controlling the operation of the memory chip 106 may be referred to as managing or control circuits. The managing or control circuits may facilitate one or more memory array operations, such as forming, erasing, programming, and reading operations.

In some embodiments, the managing or control circuits (or a portion of the managing or control circuits) for facilitating one or more memory array operations may be integrated within the memory chip 106. The memory chip controller 104 and memory chip 106 may be arranged on a single integrated circuit. In other embodiments, the memory chip controller 104 and memory chip 106 may be arranged on different integrated circuits. In some cases, the memory chip controller 104 and memory chip 106 may be integrated on a system board, logic board, or a printed circuit board (PCB).

The memory chip 106 includes memory core control circuit 108 and a memory core 110.

In various embodiments, the memory core control circuit 108 may include logic for controlling the selection of memory blocks (or arrays) within the memory core 110 such as, for example, controlling the generation of voltage references for biasing a particular memory array into a read or write state, generating row and column addresses, testing the electrical connections of interconnect structures of the memory blocks, which will be discussed in further detail below.

The memory core 110 may include one or more two-dimensional arrays of non-volatile memory cells or one or more three-dimensional arrays of non-volatile memory cells. In an embodiment, the memory core control circuit 108 and memory core 110 are arranged on a single integrated circuit. In other embodiments, the memory core control circuit 108 (or a portion of the memory core control circuit 108) and memory core 110 may be arranged on different integrated circuits.

An example memory operation may be initiated when the host 102 sends instructions to the memory chip controller 104 indicating that the host 102 would like to read data from the memory system 100 or write data to the memory system 100. In the event of a write (or programming) operation, the host 102 will send to the memory chip controller 104 both a write command and the data to be written. The data to be written may be buffered by the memory chip controller 104 and error correcting code (ECC) data may be generated corresponding with the data to be written. The ECC data, which allows data errors that occur during transmission or storage to be detected and/or corrected, may be written to the memory core 110 or stored in non-volatile memory cell within the memory chip controller 104. In an embodiment, the ECC data are generated and data errors are corrected by circuitry within the memory chip controller 104.

The memory chip controller 104 can control operation of the memory chip 106. In one example, before issuing a write operation to the memory chip 106, the memory chip controller 104 may check a status register to make sure that the memory chip 106 is able to accept the data to be written. In another example, before issuing a read operation to the memory chip 106, the memory chip controller 104 may pre-read overhead information associated with the data to be read. The overhead information may include ECC data associated with the data to be read or a redirection pointer to a new memory location within the memory chip 106 in which to read the data requested. Once a read or write operation is initiated by the memory chip controller 104, the memory core control circuit 108 may generate the appropriate bias voltages for word lines and bit lines within memory core 110, and generate the appropriate memory block, row, and column addresses.

Figure 1B:
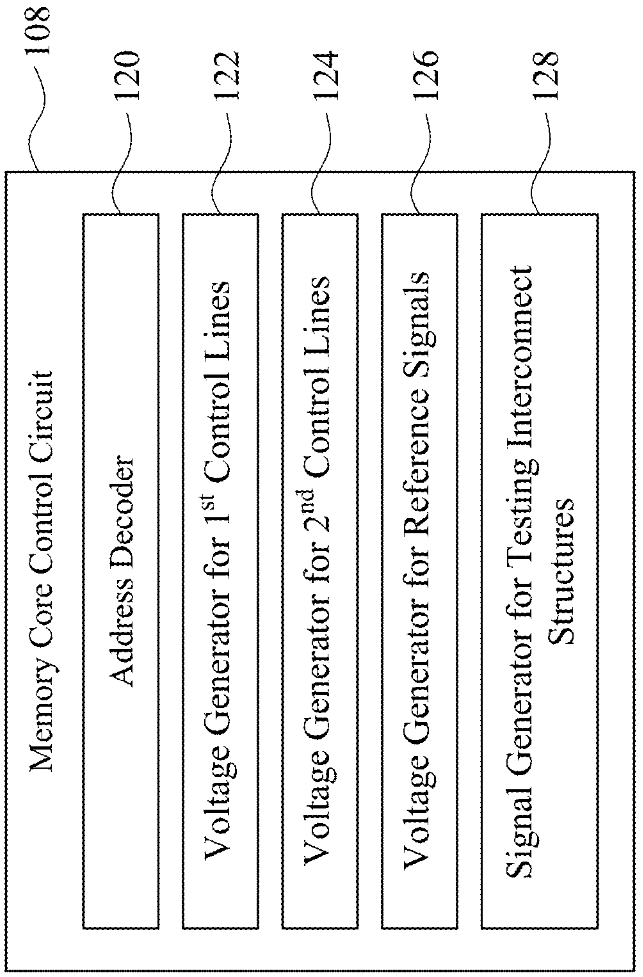
FIG. 1B illustrates a block diagram of a memory core control circuit, in accordance with some embodiments.

FIG. 1B illustrates one example block diagram of the memory core control circuit 108, in accordance with various embodiments. As shown, the memory core control circuit 108 include an address decoder 120, a voltage generator for first access lines 122, a voltage generator for second access lines 124, a signal generator for reference signals 126, and a signal generator for testing interconnect structures 128 (described in more detail below). In some embodiments, access lines may include word lines (WLs), bit lines (BLs), source/select lines (SLs), or combinations thereof. First access lines 122 may include selected WLs, selected BLs, and/or selected SLs that are used to place non-volatile memory cells into a selected state. Second access lines 124 may include unselected WLs, unselected BLs, and/or unselected SLs that are used to place non-volatile memory cells into an unselected state.

In accordance with various embodiments, the address decoder 120 can generate memory block addresses, as well as row addresses and column addresses for a particular memory block. The voltage generator (or voltage regulators) for first access lines 122 can include one or more voltage generators for generating first (e.g., selected) access line voltages. The voltage generator for second access lines 124 can include one or more voltage generators for generating second (e.g., unselected) access line voltages. The signal generators for reference signals 126 can include one or more voltage and/or current generators for generating reference voltage and/or current signals. The signal generator for testing interconnect structures 128 can generate control signals to control a number of switches to bypass one of the memory blocks at a time for testing the interconnect structures of the memory blocks, which will be discussed in further detail with respect to the method of FIG. 4.

Figure 1C:
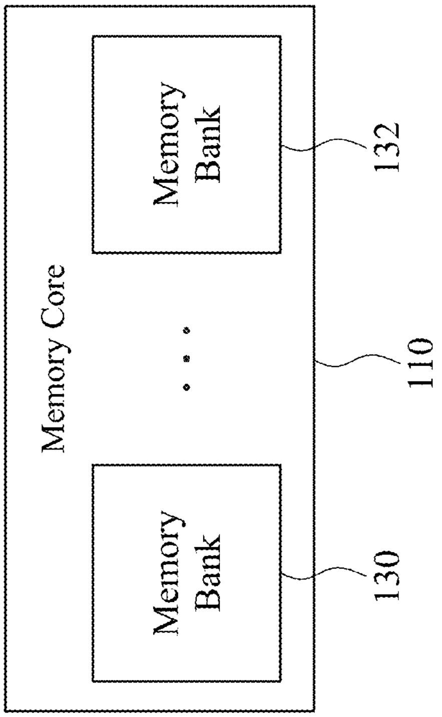
FIG. 1C illustrates a block diagram of a memory core, in accordance with some embodiments.
Figure 1D:
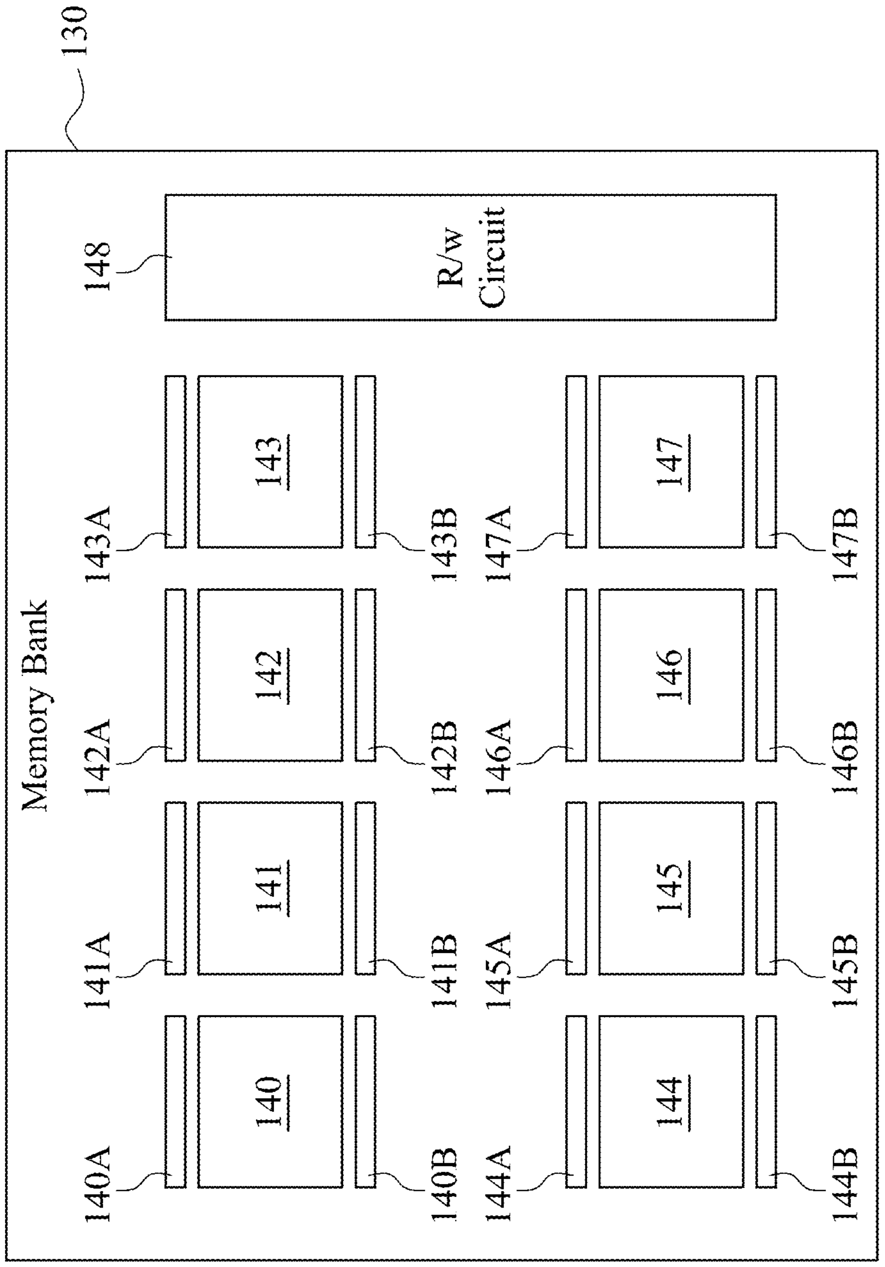
FIG. 1D illustrates a block diagram of a memory bank, in accordance with some embodiments.
Figure 1E:
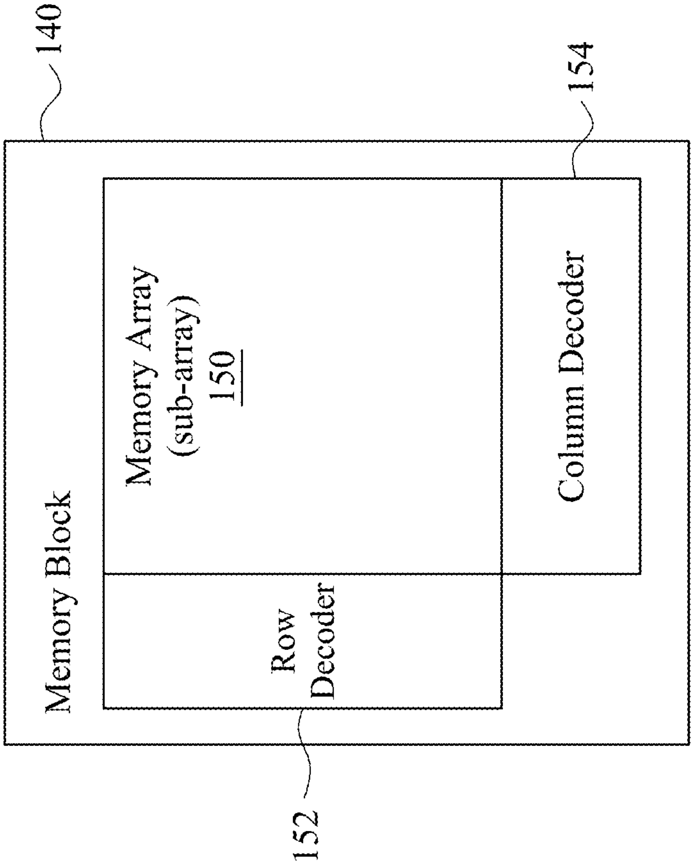
FIG. 1E illustrates a block diagram of a memory block, in accordance with some embodiments.

FIGS. 1C-1E illustrate an example organization of the memory core 110, in accordance with various embodiments. The memory core 110 includes a number of memory banks, and each memory bank includes a number of memory blocks. Although an example memory core organization is disclosed where memory banks each include memory blocks, and memory blocks each include a group of non-volatile memory cells (arranged as a memory array or sub-array), other organizations or groupings also can be used, while remaining within the scope of the present disclosure.

FIG. 1C illustrates an example block diagram of the memory core 110, in accordance with various embodiments. As shown, the memory core 110 includes memory banks 130, 132, etc. It should be appreciated the memory core 110 can include any number of memory banks, while remaining within the scope of the present disclosure. For example, a memory core 110 may include only a single memory bank or multiple memory banks (e.g., 16 or other number of memory banks).

FIG. 1D illustrates an example block diagram of one of the memory banks (e.g., 130) shown in FIG. 1C, in accordance with various embodiments. As shown, the memory bank 130 includes memory blocks 140, 141, 142, 143, 144, 145, 146, and 147, pairs of test structures 140A and 140B, 141A and 141B, 142A and 142B, 143A and 143B, 144A and 144B, 145A and 145B, 146A and 146B, and 147A and 147B respectively corresponding to the memory blocks 140 to 147, and a read/write circuit 148. It should be appreciated the memory bank 130 can include any number of memory blocks (and any according number of the test structures), while remaining within the scope of the present disclosure. For example, a memory bank may include one or more memory blocks (e.g., 32 or other number of memory blocks per memory bank). The read/write circuit 148 can include circuitry for reading and writing memory cells within the memory blocks 140 to 147. Further, although two test structures correspond to each memory block in the illustrated example of FIG. 1D (and the following figures), it should be appreciated that any number of test structures can correspond to one memory block, while remaining within the scope of the present disclosure.

In various embodiments, the test structures 140A through 147B, together with the corresponding memory blocks 140 through 147, may be formed on a single die (e.g., a singulated or cut die). Further, each pair of test structures may be disposed next to their corresponding memory block. For example, the test structures 140A and 140B may be physically disposed on top and bottom of the memory block 140, respectively. However, it should be understood that a pair of the test structures may be physically arranged next to the corresponding memory block in any manner. Continuing using the memory block 140 as a representative example, the test structures 140A and 140B may be disposed on the left and the right of the memory block 140, respectively.

In some other embodiments, the test structures may not be present on a single die (e.g., a singulated or cut die). For example, while the memory blocks of a memory core (e.g., 110) are formed on a particular die over a wafer, the corresponding test structures may be formed along scribe lines over the wafer. A scribe line (sometimes referred to as a kerf or frame) is an area in a wafer, which is used to singulate or otherwise separate individual dies at the end of wafer processing. In such embodiments, the test structures may not be present on a singulated die.

In some embodiments, the read/write circuit 148 may be shared across multiple memory blocks within a memory bank. This allows chip area to be reduced because a single group of read/write circuit 148 may be used to support multiple memory blocks. However, in some embodiments, only a single memory block may be electrically coupled to the read/write circuit 148 at a particular time to avoid signal conflicts. In some embodiments, the read/write circuit 148 may be used to write one or more pages of data into the memory blocks 140-147 (or into a subset of the memory blocks). The non-volatile memory cells within the memory blocks 140-147 may permit direct over-writing of pages (i.e., data representing a page or a portion of a page may be written into the memory blocks 140-147 without requiring an erase or reset operation to be performed on the non-volatile memory cells prior to writing the data).

In some cases, the read/write circuit 148 may be used to program a particular non-volatile memory cell to be in one of multiple (e.g., 2, 3, etc.) data states. For example, the particular non-volatile memory cell may include a single-level or multi-level non-volatile memory cell. In one example, the read/write circuits 148 may apply a first voltage difference (e.g., 2V) across the particular non-volatile memory cell to program the particular non-volatile memory cell into a first state of the multiple data states or a second voltage difference (e.g., 1V) across the particular non-volatile memory cell that is less than the first voltage difference to program the particular non-volatile memory cell into a second state of the multiple data states.

FIG. 1E illustrates an example block diagram of one of the memory blocks (e.g., 140) of the memory bank 130 of FIG. 1D, in accordance with various embodiments. As shown, the memory block 140 includes a memory array (or sometimes referred to as a memory sub-array) 150, a row decoder 152, and a column decoder 154. As disclosed herein, the memory array 150 may include a contiguous group of non-volatile memory cells, each of which can be accessed through a respective combination of access lines (e.g., a combination of one of contiguous WLs, one of contiguous BLs, and one of contiguous SLs). Such access lines may sometimes be referred to as an interface portion of the memory block, in some embodiments. The memory array 150 may include one or more layers of non-volatile memory cells. The memory array 150 may include a two-dimensional memory array or a three-dimensional memory array. The interface portion may be formed within the memory array 150, which will be shown and discussed in further detail below.

The row decoder 152 can decode a row address and select a particular WL, when appropriate (e.g., when reading or writing non-volatile memory cells in the memory array 150). The column decoder 154 can decode a column address and select one or more BLs/SLs in the memory array 150 to be electrically coupled to read/write circuits, such as the read/write circuit 148 in FIG. 1D. As a non-limiting example, the number of WLs is in the range of 4K per memory layer, the number of BLs/SLs is in the range of 1K per memory layer, and the number of memory layers is 4, which renders about 16M non-volatile memory cells contained in the memory array 150 (of the memory block 140). Continuing with the same example, a test structure (e.g., 140A and/or 140B), corresponding to the memory block 140, may include the similar number of WLs (e.g., 4K) and the similar number of memory layers (e.g., 4), but a much less number of BLs/SLs, which can allow the test structures to occupy an optimized real estate.

Figure 2:
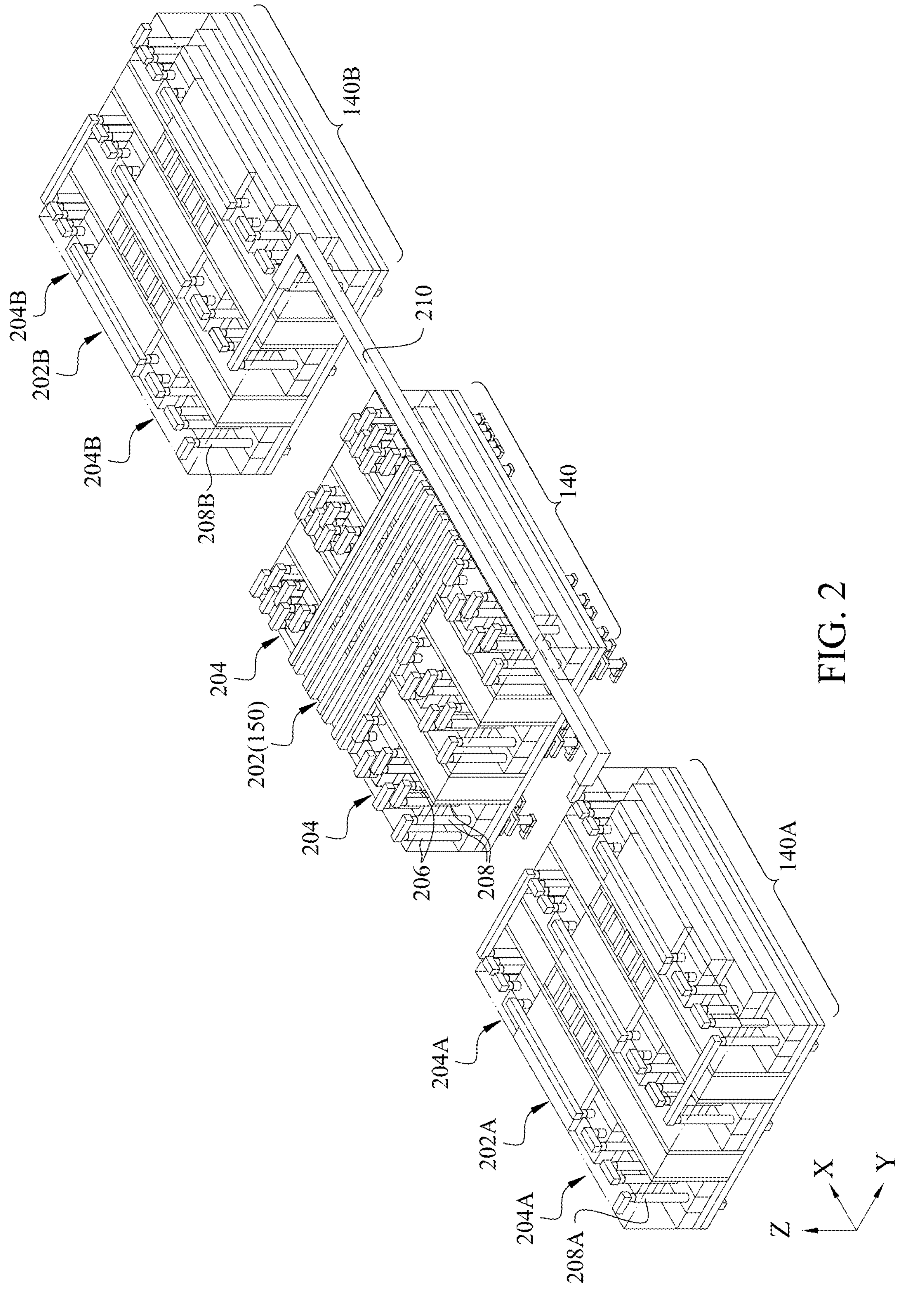
FIG. 2 illustrates a perspective view of a memory block and one or more test structures, in accordance with some embodiments.

FIG. 2 illustrates a perspective view of a portion of the memory block 140, and the test structures 140A and 140B, according to various embodiments of the present disclosure. In the following discussions, the memory block 140 (and the corresponding test structures 140A-B) are selected as a representative example. It should be understood that other memory blocks (and corresponding test structures), as disclosed herein, are substantially similar to the memory block 140 (and the test structures 140A-B), and thus, the discussions are not repeated. Further, the perspective view of FIG. 2 is simplified, and thus, it should be understood that any of various other features/components can also be included in FIG. 2, while remaining within the scope of the present disclosure.

As shown, the memory block 140 includes the memory array (or sub-array) 150, which is herein referred to as memory array 202. Such a memory array 202 includes a number of memory cells formed across a number of memory layers (e.g., 3 memory layers as shown) stacked on top of one another along a vertical direction, e.g., the Z direction.

Each of the memory cells may include a single-gate or a surrounding-gate transistor, which will be discussed in further detail below. The memory block 140 includes a number of interface portions 204 located across the memory array 202, which allows each memory cell of the memory array 202 to be accessed (or otherwise controlled). In some embodiments, the interface portions 204 each has a staircase or step profile in the Z-direction, as described later in further detail herein. To electrically access the memory array 202 through the interface portion 204, the memory block 140 further includes a number of first interconnect structures 206 (e.g., first via structures) extending along the Z direction that land on respective stairs of the WLs in the interface portion 204. The memory block 140 further includes a number of second interconnect structures 208 (e.g., second via structures) extending along the Z-direction that electrically couple to driver circuits underneath the memory block 140. The memory block 140 further includes a number of lateral interconnect structures (e.g., extending along the Y-direction) WL, BL, and SL routing. These lateral interconnect structures are explained in more detail below with FIGS. 24A and 24B.

In various embodiments, each of the test structures 140A and 140B is formed to emulate the interface portion 204 and interconnect structures 206 of the memory block 140. Thus, each of the test structures 140A and 140B can have the similar configuration as the memory block 140. For example, the test structure 140A includes a test memory array 202A having a number of memory cells formed across a number of memory layers, one or more test interface portions 204A (each of which has a staircase or step profile), and a number of test interconnect structures 208A; and the test structure 140B includes a test memory array 202B having a number of memory cells formed across a number of memory layers, one or more test interface portions 204B (each of which has a staircase or step profile), and a number of test interconnect structures 208B. The test interconnect structures 208A and 208B are formed concurrently with the second interconnect structures 208 of the memory block 140 in order to mirror the profiles and dimensions of the second interconnect structures 208.

Further, the test interconnect structures 208A of the test structure 140A are electrically coupled to one another through a number of conductive structures 210; and the test interconnect structures 208B of the test structures 140B are electrically coupled to one another through a number of conductive structures 210. Specifically, the test interconnect structures 208A may be electrically coupled to one another in series; and the test interconnect structures 208B may be electrically coupled to one another in series. Such serially connected test interconnect structures 208A and serially connected test interconnect structures 208B may be electrically connected to each other through a number of conductive structures 210.

By electrically coupling the test interconnect structures of at least one of the test structures 140A or 140B in series (while electrically isolated from the second interconnect structures 208 of the memory block 140), electrical connections of the second interconnect structures 208 can be accurately examined through the at least one test structure, and normal operation of the memory block 140 will not be interfered. For example, since the test interconnect structures of the test structure(s) are formed concurrently with the interconnect structures within the memory block 140 (e.g., through the same lithography process, and then the same etching process), any defect formed on the second interconnect structures within the memory block 140 can be mirrored to (or reflected on) the test interconnect structures within the test structure(s). As such, by testing whether the level of a current flowing through the serially connected test interconnect structures satisfies a condition (e.g., less than a threshold), whether there is any open circuit present between the test interconnect structures and the test interface portions can be identified or otherwise determined. Further, by serially connecting the respective test structures of different memory blocks, which of the memory blocks contains electrical connection issues in its second interconnect structures can also be accurately identified, which will be discussed in further detail as follows.

Figure 3A:
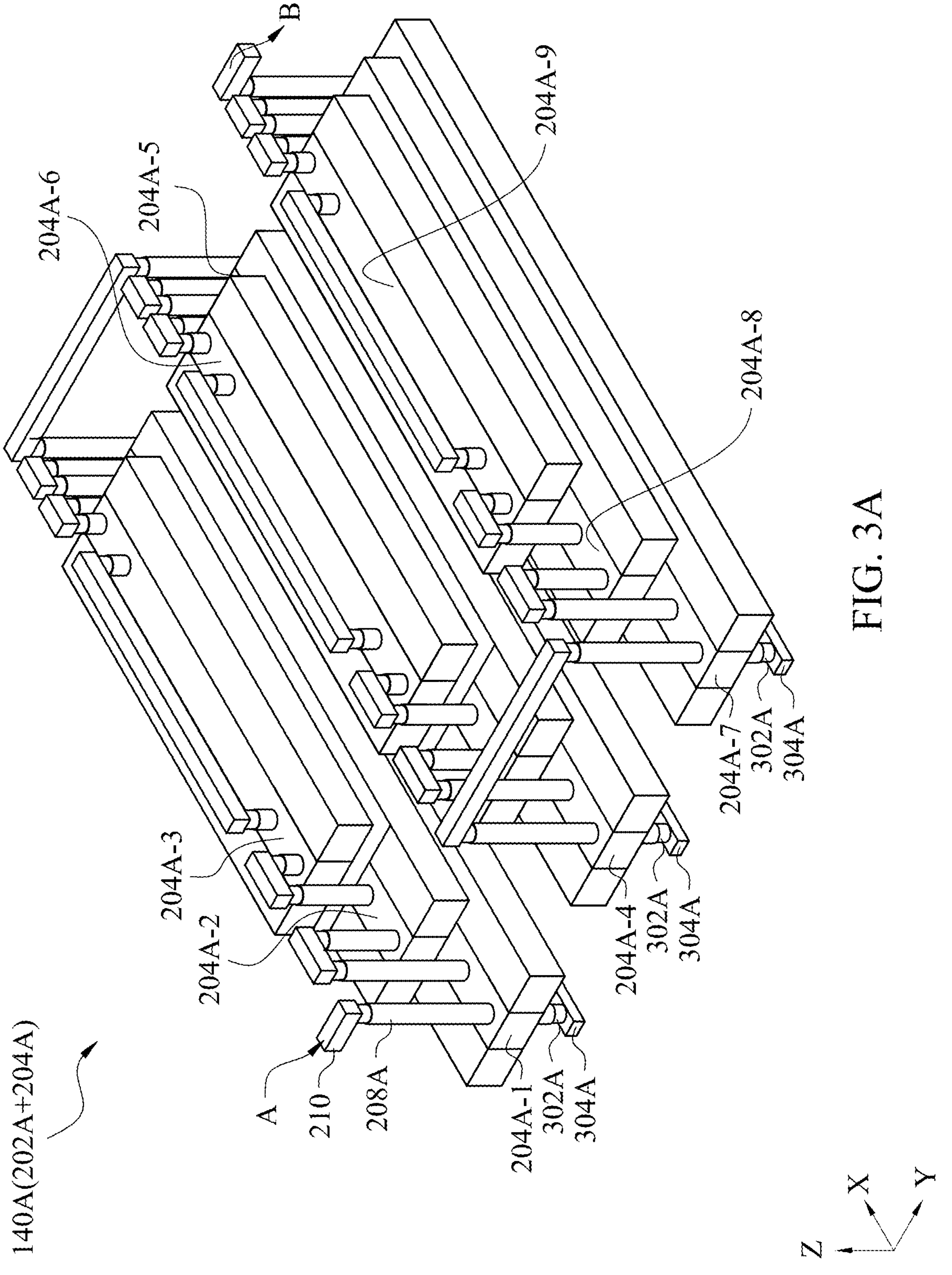
FIGS. 3A-B illustrate perspective views of portions of a test structure including an interface portion and a number of test interconnect structures, in accordance with some embodiments.
Figure 3B:
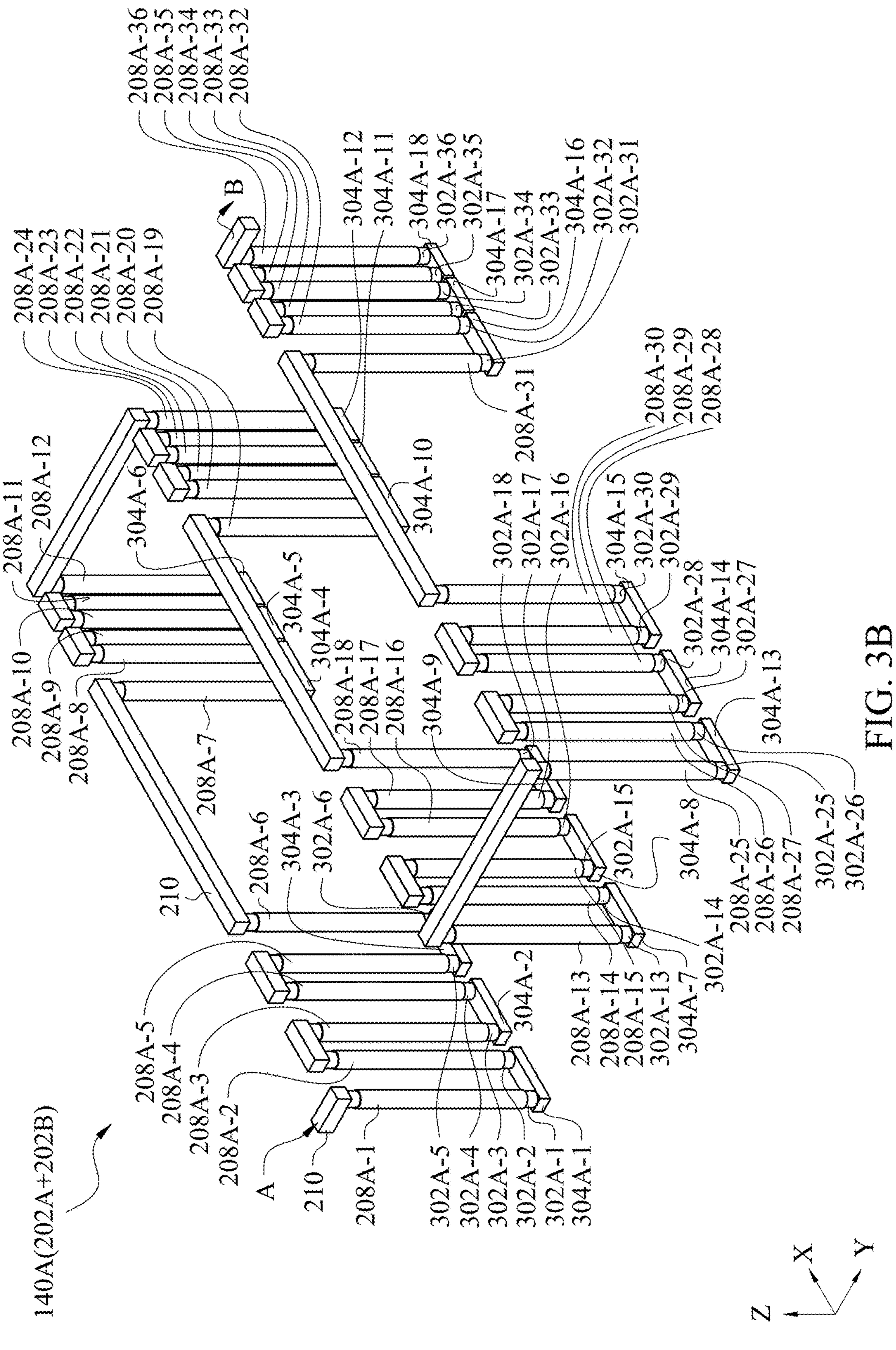

To illustrate how to test the electrical connections of a number of serially connected test interconnect structures within a test structure, a portion of the test structure 140A that includes only the test interface portions 204A and the test interconnect structures 208A, which is selected as a representative example, is reproduced in FIGS. 3A-B.

As illustrated, the test structure 140A further include a number of bottom interconnect structures 302 (e.g., bottom via structures) and bottom metal routings 304 to electrically couple the test interconnect structures 208A to each other in series. The test interconnect structures 208A extend (e.g., in the Z-direction) through a number of test sacrificial layers: 204A-1, 204A-2, 204A-3, 204A-4, 204A-5, 204A-6, 204A-7, 204A-8, and 204A-9 that extend along the X-direction and are separated from each other along the Z-direction. In various embodiments, the test interconnect structures 208A can mimic the dimensions and profiles of the second interconnect structures 208 formed within the memory block 140, which will be discussed in further detail below.

As the test sacrificial layers 204A-1 through 204A-9 follow the staircase profile of the sacrificial layers and conductive structures within the memory block 140, in various embodiments, the test sacrificial layers 204A-1 through 204A-9 can present a staircase profile. Specifically, the test sacrificial layers at the bottommost memory layer may extend along a lateral direction with a longest length, the test sacrificial layers at the next upper memory layer may extend along the same lateral direction with a second longest length, and so on. For example in FIG. 3A, the test sacrificial layers 204A-1, 204A-4, and 204A-7, disposed in the first memory layer, each extend along the X direction with a longest length, the test sacrificial layers 204A-2, 204A-5, and 204A-8, disposed in the second memory layer, each extend along the X direction with a second longest length, and the test sacrificial layers 204A-3, 204A-6, and 204A-9, disposed in the third memory layer, each extend along the X direction with a third longest length.

Each of the test interconnect structures 208A can extend along the Z-direction through a corresponding one of the test sacrificial layers 204A-1 through 204A-9 (of the test interface portion 204A) to electrically couple to one of the bottom interconnect structures 302 and bottom metal routings 304.

For example in FIG. 3B, the test interconnect structures 208A-1 and 208A-2 are coupled to one of the metal routings 210 on one end and coupled to the test bottom interconnect structures 302A-1 and 302A-2, respectively, through the test sacrificial layer 204A-1 (FIG. 3A). The test bottom interconnect structures 302A-1 and 302A-2 are coupled to the test bottom metal routing 304A-1. The test interconnect structures 208A-3 and 208A-4 are coupled to one of the metal routings 210 on one end and coupled to the test bottom interconnect structures 302A-3 and 302A-4, respectively, through the test sacrificial layer 204A-2 (FIG. 3A). The test bottom interconnect structures 302A-3 and 302A-4 are coupled to the test bottom metal routing 304A-2. The test interconnect structures 208A-5 and 208A-6 are coupled to one of the metal routings 210 on one end and coupled to the test bottom interconnect structures 302A-5 and 302A-6, respectively, through the test sacrificial layer 204A-3 (FIG. 3A). The test bottom interconnect structures 302A-5 and 302A-6 are coupled to the test bottom metal routing 304A-3. The test interconnect structures 208A-7 and 208A-8 are coupled to one of the metal routings 210 on one end and coupled to the test bottom interconnect structures 302A-7 and 302A-8 (not shown in the perspective view of FIG. 3B), respectively, through the test sacrificial layer 204A-3 (FIG. 3A). The test bottom interconnect structures 302A-7 and 302A-8 are coupled to the test bottom metal routing 304A-4. The test interconnect structures 208A-9 and 208A-10 are coupled to one of the metal routings 210 on one end and coupled to the test bottom interconnect structures 302A-9 and 302A-10 (not shown in the perspective view of FIG. 3B), respectively, through the test sacrificial layer 204A-2 (FIG. 3A). The test bottom interconnect structures 302A-9 and 302A-10 are coupled to the test bottom metal routing 304A-5. The test interconnect structures 208A-11 and 208A-12 (not shown in the perspective view of FIG. 3B) are coupled to one of the metal routings 210 on one end and coupled to the test bottom interconnect structures 302A-11 and 302A-12, respectively, through the test sacrificial layer 204A-1 (FIG. 3A). The test bottom interconnect structures 302A-11 and 302A-12 are coupled to the test bottom metal routing 304A-6.

The test interconnect structures 208A-13 and 208A-14 are coupled to one of the metal routings 210 on one end and coupled to the test bottom interconnect structures 302A-13 and 302A-14, respectively, through the test sacrificial layer 204A-4 (FIG. 3A). The test bottom interconnect structures 302A-13 and 302A-14 are coupled to the test bottom metal routing 304A-7. The test interconnect structures 208A-15 and 208A-16 are coupled to one of the metal routings 210 on one end and coupled to the test bottom interconnect structures 302A-15 and 302A-16, respectively, through the test sacrificial layer 204A-5 (FIG. 3A). The test bottom interconnect structures 302A-15 and 302A-16 are coupled to the test bottom metal routing 304A-8. The test interconnect structures 208A-17 and 208A-18 are coupled to one of the metal routings 210 on one end and coupled to the test bottom interconnect structures 302A-17 and 302A-18, respectively, through the test sacrificial layer 204A-6 (FIG. 3A). The test bottom interconnect structures 302A-17 and 302A-18 are coupled to the test bottom metal routing 304A-9. The test interconnect structures 208A-19 and 208A-20 are coupled to one of the metal routings 210 on one end and coupled to the test bottom interconnect structures 302A-19 and 302A-20, respectively, through the test sacrificial layer 204A-6 (FIG. 3A). The test bottom interconnect structures 302A-19 and 302A-20 (not shown in the perspective view of FIG. 3B) are coupled to the test bottom metal routing 304A-10. The test interconnect structures 208A-21 and 208A-22 are coupled to one of the metal routings 210 on one end and coupled to the test bottom interconnect structures 302A-21 and 302A-22 (not shown in the perspective view of FIG. 3B), respectively, through the test sacrificial layer 204A-5 (FIG. 3A). The test bottom interconnect structures 302A-21 and 302A-22 are coupled to the test bottom metal routing 304A-11. The test interconnect structures 208A-23 and 208A-24 are coupled to one of the metal routings 210 on one end and coupled to the test bottom interconnect structures 302A-23 and 302A-24 (not shown in the perspective view of FIG. 3B), respectively, through the test sacrificial layer 204A-4 (FIG. 3A). The test bottom interconnect structures 302A-23 and 302A-24 are coupled to the test bottom metal routing 304A-12.

The test interconnect structures 208A-25 and 208A-26 are coupled to one of the metal routings 210 on one end and coupled to the test bottom interconnect structures 302A-25 and 302A-26, respectively, through the test sacrificial layer 204A-7 (FIG. 3A). The test bottom interconnect structures 302A-25 and 302A-26 are coupled to the test bottom metal routing 304A-13. The test interconnect structures 208A-27 and 208A-28 are coupled to one of the metal routings 210 on one end and coupled to the test bottom interconnect structures 302A-27 and 302A-28, respectively, through the test sacrificial layer 204A-8 (FIG. 3A). The test bottom interconnect structures 302A-27 and 302A-28 are coupled to the test bottom metal routing 304A-14. The test interconnect structures 208A-29 and 208A-30 are coupled to one of the metal routings 210 on one end and coupled to the test bottom interconnect structures 302A-29 and 302A-30, respectively, through the test sacrificial layer 204A-9 (FIG. 3A). The test bottom interconnect structures 302A-29 and 302A-30 are coupled to the test bottom metal routing 304A-15. The test interconnect structures 208A-31 and 208A-32 are coupled to one of the metal routings 210 on one end and coupled to the test bottom interconnect structures 302A-31 and 302A-32, respectively, through the test sacrificial layer 204A-9 (FIG. 3A). The test bottom interconnect structures 302A-31 and 302A-32 are coupled to the test bottom metal routing 304A-16. The test interconnect structures 208A-33 and 208A-34 are coupled to one of the metal routings 210 on one end and coupled to the test bottom interconnect structures 302A-33 and 302A-34, respectively, through the test sacrificial layer 204A-8 (FIG. 3A). The test bottom interconnect structures 302A-33 and 302A-34 are coupled to the test bottom metal routing 304A-17. The test interconnect structures 208A-35 and 208A-36 are coupled to one of the metal routings 210 on one end and coupled to the test bottom interconnect structures 302A-35 and 302A-36, respectively, through the test sacrificial layer 204A-7 (FIG. 3A). The test bottom interconnect structures 302A-35 and 302A-36 are coupled to the test bottom metal routing 304A-18.

With such a conduction path by serially connecting the test interconnect structures 208A to the test bottom interconnect structures 302A and test bottom metal routings 304A, electrical connections between the test interconnect structures 208A and the second interconnect structures 208 in the memory block can be accurately examined. In various embodiments, by applying a first signal (e.g., a voltage signal) on one end of the test structure 140A (arrow "A" indicated in FIGS. 3A-B), the level of a second signal (e.g., a current signal) detected on the other end of the test structure 140A (arrow "B" indicated in FIGS. 3A-B) can be used to determine whether one or more open circuits are present along this conduction path. For example, if there is any open circuit present along the conduction path, the level of the second signal may be lower than a threshold. The threshold can be pre-calibrated based on various process parameters (e.g., the resistivity of a material of the test interconnect structures 208A, a number of the test interconnect structures 208A, etc.). On the other hand, if there is no open circuit present, the level of the second signal should be equal to or greater than the threshold.

In response to determining the presence of an open circuit in the test structure, it is determined that an open circuit can also be present between the second interconnect structures electrically coupled to the driver circuits and conductive structures (e.g., WLs) of a corresponding memory block. This can be because the memory block and the test structure share the same processing steps to make the interconnect structures and test interconnect structures. In some embodiments, more than one test structure, e.g., serially connecting the test structures 140A and 140B as illustrated in FIG. 2, can be used to test the electrical connections between interconnect structures and driver circuits in a corresponding memory block, e.g., the memory block 140. Further, the operation principle can be applied to test a number of memory blocks, the memory blocks 140 to 147, which will be discussed with respect to the method of FIG. 4.

Figure 4:
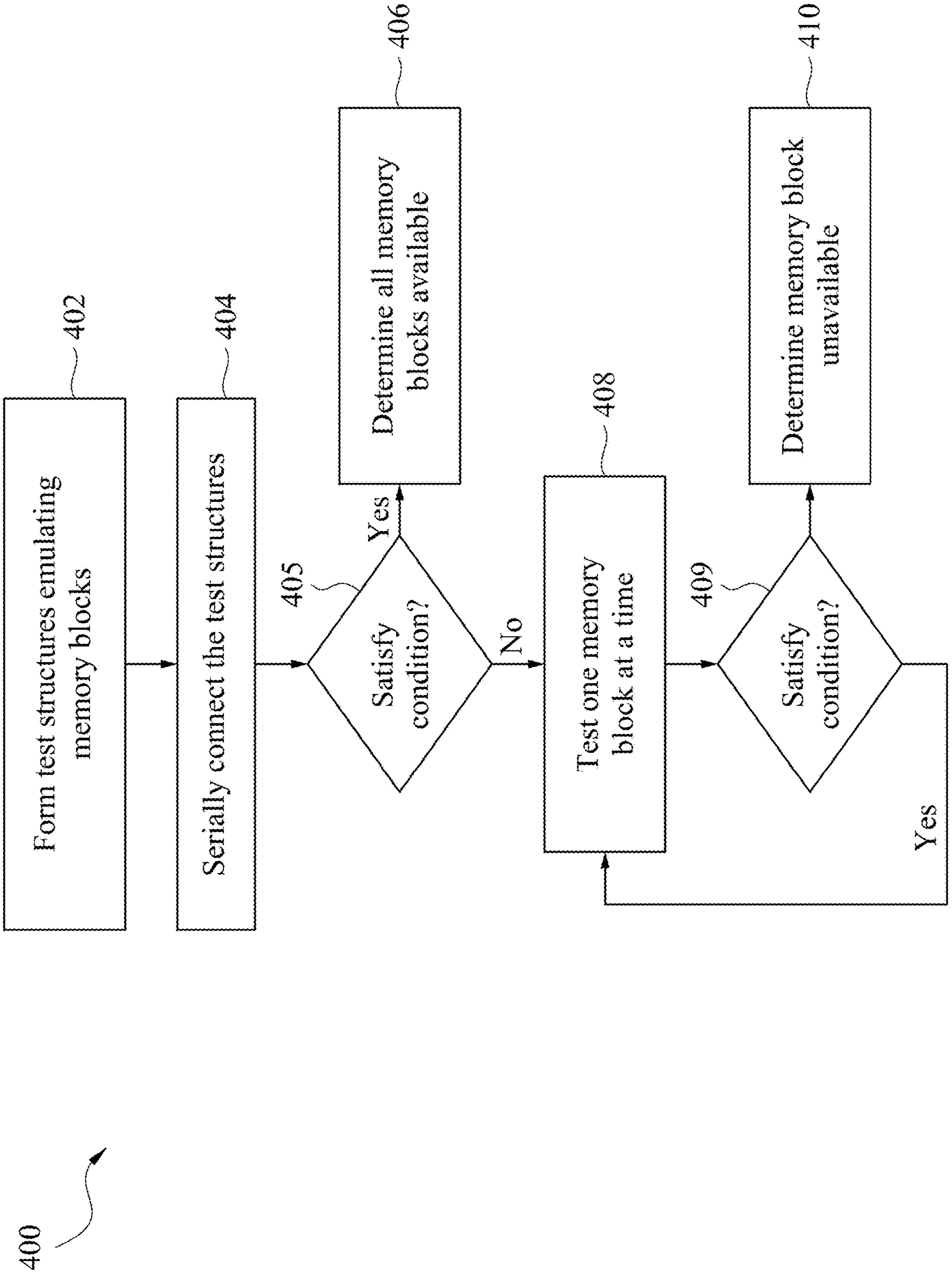
FIG. 4 illustrates a flow chart of an example method to test a three-dimensional memory device, in accordance with some embodiments.

Referring to FIG. 4, depicted is a flow chart of an example method 400 for testing electrical connections of second interconnect structures of a number of memory blocks, in accordance with various embodiments. Some of the functionalities or operations of the method 400 may be implemented using, or performed by, one or more components of the memory core control circuit 108 depicted in FIG. 1B, e.g., the signal generator for testing interconnect structures 128 (hereinafter "signal generator 128"). It is noted that the method 400 is merely an example, and is not intended to limit the present disclosure. Accordingly, it is understood that additional operations may be provided before, during, and after the method 400, and that some other operations may only be briefly described herein.

The method 400 start with operation 402 in which a number of test structures that emulate a number of memory blocks, respectively, are formed. In some embodiments, there can be one or more test structures that emulate each memory block. The one or more test structures can be disposed next to its or their corresponding memory block. In some embodiments, each of the test structures can emulate, simulate, or otherwise follow at least the second interconnect structures (e.g., second vias) of a corresponding memory block.

Using the memory bank 130 that includes eight memory blocks 140 to 147 (FIG. 1D) as an example in the following discussions of the method 400, FIG. 5 reproduces four of these memory blocks 140 to 143, with their corresponding (emulating) test structures 140A-B to 143A-B disposed next thereto, respectively. However, it should be appreciated that the method 400 is not limited to test any number of memory blocks. For example, by forming a number of test structures in accordance with any number of memory blocks, the method 400 can be used to test or otherwise monitor the electrical connections of each of such memory blocks. In various embodiments, the test structures 140A-B can each have a number of test interconnect structures (e.g., 208A-1 through 208A-36 as shown in FIG. 3B) that emulate second interconnect structures 208 of the memory block 140.

The method 400 proceeds to operation 404 in which the test structures are electrically connected to one another in series. In addition to electrically coupling the test structures through the test interconnect structures in series (as illustrated with respect to FIGS. 3A-B), one of the one or more (e.g., 2) test structures, corresponding to a particular memory block, is connected to the other of the one or more test structures. Further, one of the one or more test structures, corresponding to a first memory block, is connected to one of the one or more test structures, corresponding to a second memory block. Such a connection across different memory blocks may be controlled through a number of switches. In some embodiments, the signal generator 128 can control (e.g., activate/inactivate, or otherwise turn on/off) those switches, so as to connect all of the memory blocks in series or bypass one or more of the memory blocks, which will be discussed below.

Figure 5:
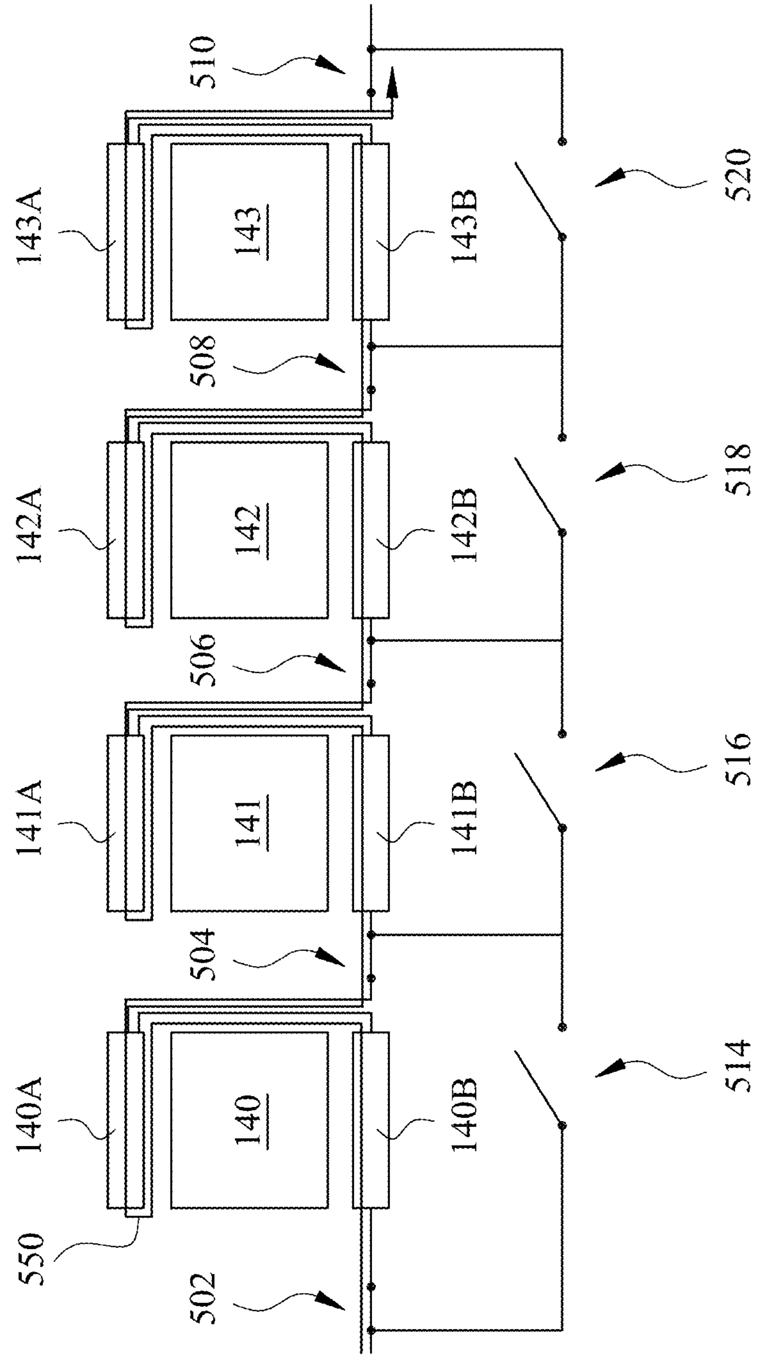
FIG. 5 illustrates a block diagram of a number of test structures electrically coupled to one another in series, in accordance with some embodiments.

For example in FIG. 5, the test structures 140A and 140B, corresponding to the memory block 140, are connected to each other. Further, the test structure 140B can be connected to a component (not shown) through a switch 502 (when activated), and the test structure 140A can be connected to one of the test structures, 141B, corresponding to the next memory block 141, through a switch 504 (when activated). The test structures 141A and 141B, corresponding to the memory block 141, are connected to each other. Further, the test structure 141A is connected to one of the test structures, 142B, corresponding to the next memory block 142, through a switch 506 (when activated). The test structures 142A and 142B, corresponding to the memory block 142, are connected to each other. Further, the test structure 142A is connected to one of the test structures, 143B, corresponding to the next memory block 143, through a switch 508 (when activated). The test structures 143A and 143B, corresponding to the memory block 143, are connected to each other. Further, the test structure 143A is connected to a component (not shown) through a switch 510 (when activated).

Moreover, switches 514, 516, 518, and 520 can provide one or more bypass paths. Each of the switches can correspond to a respective memory block to bypass the memory block (and its corresponding test structure(s)). Specifically, the switch 514 can be alternately activated with respect to the switch 504 to bypass the memory block 140; the switch 516 can be alternately activated with respect to the switch 506 to bypass the memory block 141; the switch 518 can be alternately activated with respect to the switch 508 to bypass the memory block 142; and the switch 520 can be alternately activated with respect to the switch 510 to bypass the memory block 143. For example, when the switch 504 is deactivated and the switch 514 is activated, the memory block 140 (and the corresponding test structures 140A-B) can be bypassed; when the switch 506 is deactivated and the switch 516 is activated, the memory block 141 (and the corresponding test structures 141A-B) can be bypassed; when the switch 508 is deactivated and the switch 518 is activated, the memory block 142 (and the corresponding test structures 142A-B) can be bypassed; and when the switch 510 is deactivated and the switch 520 is activated, the memory block 143 (and the corresponding test structures 143A-B) can be bypassed.

In some embodiments, each of the switches 502 to 520 may include an n-type metal-oxide-semiconductor (MOS) transistor, a p-type MOS transistor, a transmission gate, a fuse, an anti-fuse, combinations thereof, or any other suitable transistor. It should be understood that the switches 502 to 520 can each include a device/feature suitable to functions as a switch, while remaining within the scope of the present disclosure. In some embodiments, the switches 502 to 520 can be formed as part of a memory device that contains the memory blocks 140-143. Further, the switches 502 to 520 can be formed above or below the memory blocks 140-143. For example, the switches 502 to 520 may be formed on the front-end of a substrate, while the memory blocks 140-143 may be formed on the back-end of the substrate. In another example, the memory blocks 140-143 may be formed on the back-end of a substrate, and the switches 502 to 520 may also be formed on the back-end, and over the memory blocks 140-143. In yet another example, the switches 502 to 520 can be embedded into processing of the memory blocks 140-143. In yet another example, the switches 502 to 520 can be separated formed as a separated device, and then integrated into a memory device containing the memory blocks 140-143.

In some embodiments, the signal generator 128, by default, can activate the switches 502 to 510 and deactivate the switches 514 to 520, so as to electrically connect the test structures in series (operation 404). As such, a conduction path 550 can be provided through the test structures 140B, 140A, 141B, 141A, 142B, 142A, 143B, and 143A, as shown in FIG. 5.

Next, the method 400 proceeds to a first determination operation 405 to determine whether a condition is satisfied. For example, the signal generator 128 can apply a first signal (e.g., a voltage signal) on one end of the conduction path 550, and detect the level of a second signal (e.g., a current signal) on the other end of the conduction path 550. Upon detecting the second signal, the signal generator 128 can determine whether the level of the second signal satisfies a condition (e.g., greater than a threshold). The threshold can be pre-calibrated based on various process parameters (e.g., the resistivity of a material of the test interconnect structures of the test structures 140 to 143, a number of the test interconnect structures formed across the test structures 140 to 143, etc.).

If the condition is satisfied, the method 400 proceeds to operation 406 to determine all the memory blocks 140 to 143 as available memory blocks. Alternatively stated, the electrical connections between the second interconnect structures and the driver circuits of each of the memory blocks 140 to 143 can be determined as having no open circuit issues. On the other hand, if the condition is not satisfied, the method 400 proceeds to operation 408 to test one of the memory blocks at a time. To test one of the memory blocks at a time, the rest of the memory blocks (and their test structure(s)) may be bypassed, which allows the memory block(s) that have open circuit issues to be identified.

Figure 6:
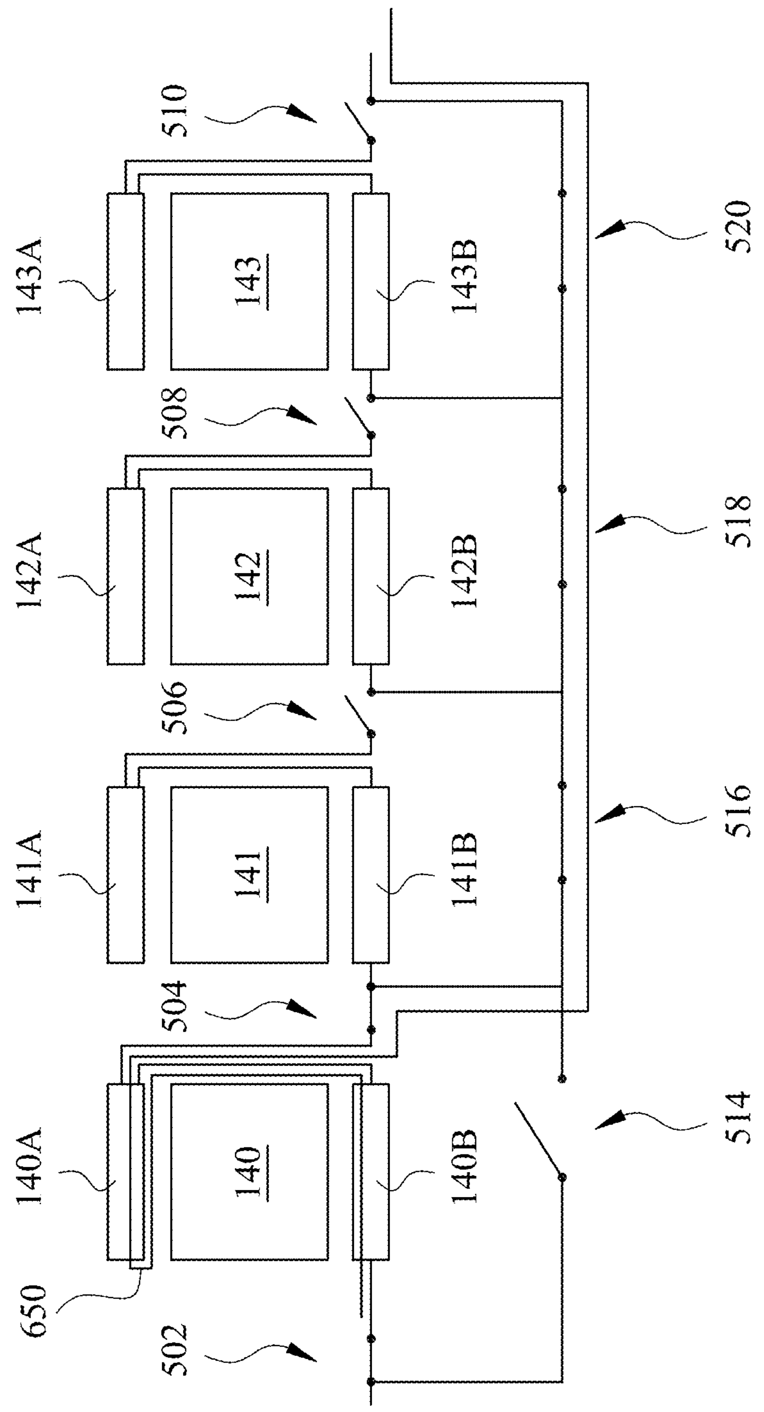
FIG. 6 illustrates an example block diagram of a number of test structures in which some of the test structures are bypassed, in accordance with some embodiments.

For example, upon determining that the level of the detected second signal does not satisfy the threshold (at operation 405), the signal generator 128 can first test the memory block 140 by bypassing the rest of the memory blocks (e.g., the memory blocks 141 to 143 in the current example). Specifically, the signal generator 128 can deactivate the switches 506 through 514 and activate the switches 502 through 504 so as to form a conduction path 650. The conduction path 650 can be provided through only the test structures for the memory block 140 being tested (e.g., 140A and 140B), as illustrated in FIG. 6. Along such a conduction path, the test structures, corresponding to the rest of the memory blocks 141 to 143, are bypassed. The signal generator 128 can again determine whether the level of the second signal satisfies the threshold (operation 409).

If not (i.e., the level of the second signal equal to or less than the threshold), the method 400 can proceed to operation 410 in which the tested memory block is determined to have the connection issues. In some embodiments, the signal generator 128 may determine the currently tested memory block as unavailable. The signal generator 128 can record identification (e.g., address information) of such an unavailable memory block, which may be used as flag to allow a user (e.g., host 102 of FIG. 1A) to skip accessing the memory block.

Figure 7:
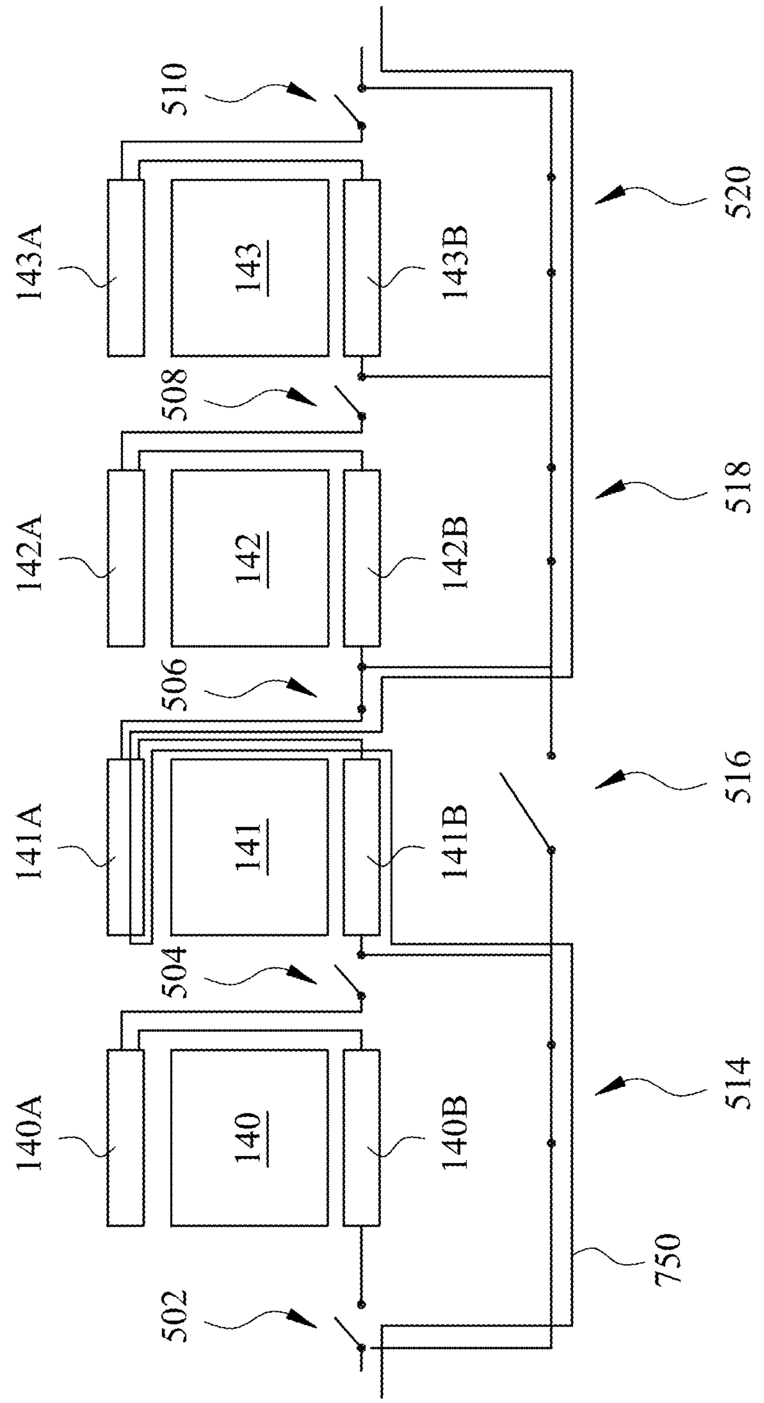
FIG. 7 illustrates another example block diagram of a number of test structures in which some of the test structures are bypassed, in accordance with some embodiments.

On the other hand, if so (i.e., the level of the second signal greater than the threshold), the method 400 can again proceed to operation 408 to test the next memory block by bypassing the rest of the memory blocks. For example, the signal generator 128 can then test the memory block 141 by bypassing the rest of the memory blocks (e.g., the memory blocks 140, 142, and 143 in the current example). Specifically, the signal generator 128 can deactivate the switches 502 through 510 and 516, and activate the switches 514, 518, and 520 so as to form a conduction path 750. The conduction path 750 can be provided through only the test structures for the memory block 141 being tested (e.g., 141A and 141B), as illustrated in FIG. 7. Along such a conduction path, the test structures, corresponding to the rest of the memory blocks 140, 142, and 143, are bypassed. The signal generator 128 can again determine whether the level of the second signal satisfies the threshold (operation 409). If not, the signal generator 128 may determine the currently tested memory block as unavailable; and if so, the signal generator 128 may continue testing the rest of the memory blocks by iteratively performing the operations 408 and 409. The signal generator 128 may continue performing such an iteration of operations until the unavailable memory block(s) are identified.

FIG. 8 illustrates a flowchart of a method 800 to form a memory device test structure, according to various embodiments. For example, at least some of the operations (or steps) of the method 800 can be used to form a three-dimensional memory device (e.g., any of the test structures 140A-B, 141A-B, 142A-B, 143A-B, 144A-B, 145A-B, 146A-B, and 147A-B, as herein disclosed). It should be noted that the method 800 is merely an example, and is not intended to limit the present disclosure. Accordingly, it is understood that additional operations may be provided before, during, and after the method 800 of FIG. 8, and that some other operations may only be briefly described herein.

In some embodiments, operations of the method 800 may be associated with cross-sectional views of an example 3D memory device test structure 900 at various fabrication stages as shown in FIGS. 9, 10, 11, 12, 13, 14, 15, 16, 17, 18, 19, 20A-C, 21A-C, and 22A-C respectively, which will be discussed in further detail below. While various operations of the method 800 and associated illustrations shown in FIGS. 9-19 are described with respect to the 3D memory device test structure 900 that includes a number of single-gate memory cells, it should be understood that the operations can be equally applicable to any of various other types of memory cells such as, for example, surrounding-gate memory cells.

In brief overview, the method 800 starts with operation 802 of forming bottom interconnect structures and bottom metal routings. The method 800 proceeds to operation 804 in of forming a stack over a substrate. The method 800 proceeds to operation 806 of patterning the stack in a staircase profile. The method 800 proceeds to operation 808 of depositing an intermetal dielectric (IMD). The method 800 proceeds to operation 810 of forming a number of word line (WL) trenches. The method 800 proceeds to operation 812 of forming a number of WLs. The method 800 proceeds to operation 814 of depositing a number of memory layers and a number of channel layers. The method 800 proceeds to operation 816 of patterning the channel layers. The method 800 proceeds to operation 818 of forming a number of (source/select line) SLs and number of bit lines (BLs). The method 800 proceeds to operation 820 of forming a number of test interconnect structures. The method 800 proceeds to operation 822 of forming a number of metal routings.

Figure 8A:
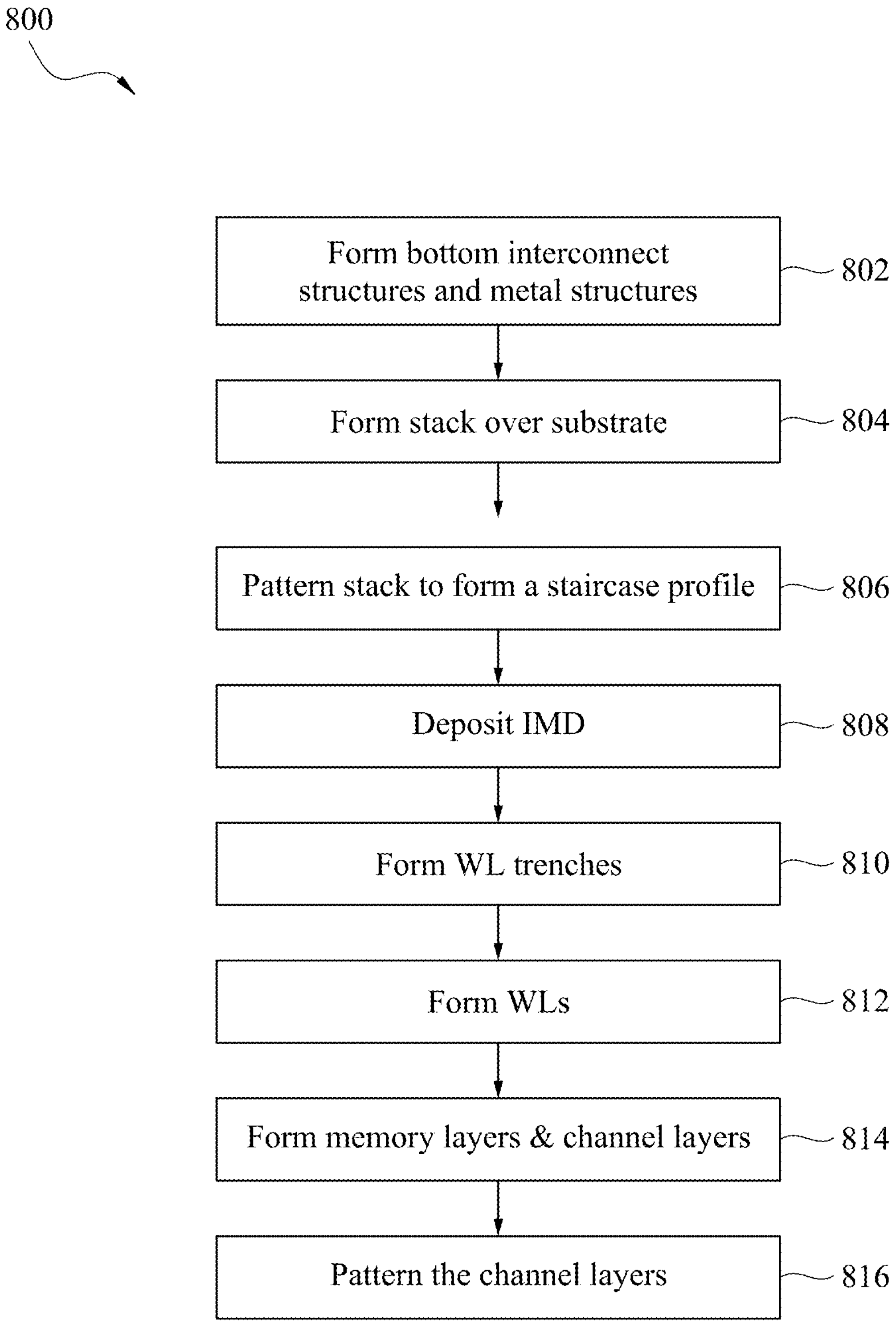
FIGS. 8A-B illustrate a flow chart of an example method to make a three-dimensional memory device test structure, in accordance with some embodiments.
Figure 8B:
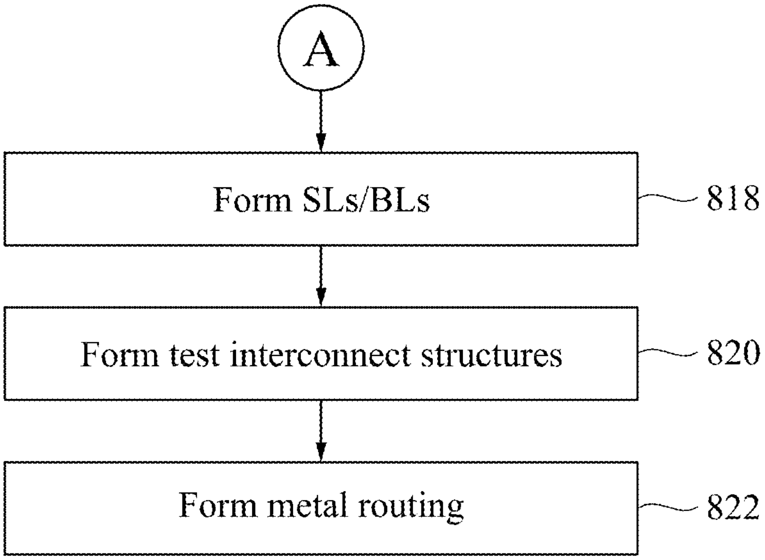
Figure 9:
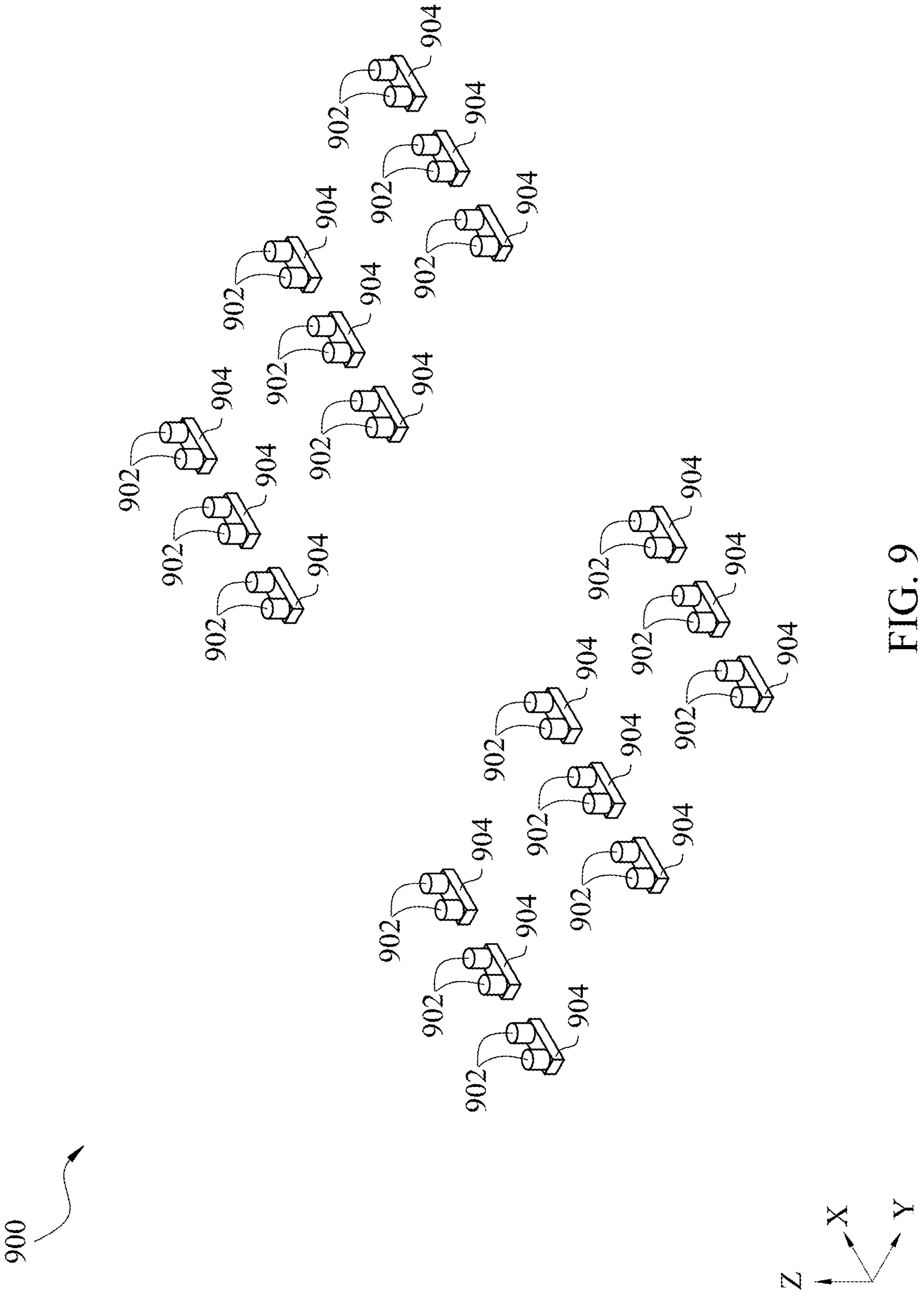
FIGS. 9, 10, 11, 12, 13, 14, 15, 16, 17, and 18 each illustrate a perspective view of an example three-dimensional memory device test structure during various fabrication stages, made by the method of FIGS. 8A-B, in accordance with some embodiments.

Corresponding to operation 802 of FIG. 8, FIG. 9 is a perspective view of the 3D memory device test structure 900 including a plurality of bottom interconnect structures and a plurality of bottom metal routings, in accordance with various embodiments.

A plurality of bottom metal routings 904 may be formed form a metallic material including at least one metal material such as, but not limited to, tungsten, copper, cobalt, ruthenium, titanium, tantalum, combinations thereof, or any other suitable material. The bottom metal routings 904 can be formed by a conformal deposition method, which can be, for example, chemical vapor deposition (CVD), atomic layer deposition (ALD), electroless plating, electroplating, combinations thereof, or any other suitable method. The plurality of bottom metal routings may extend horizontally along the X-direction.

A plurality of bottom interconnect structures (e.g., bottom via structures) 902 may be formed on the bottom metal routings 904. The bottom interconnect structures 902 may extend vertically. The bottom interconnect structures 902 may be formed form a metallic material including at least one metal material such as, but not limited to, tungsten, copper, cobalt, ruthenium, titanium, tantalum, combinations thereof, or any other suitable material. The bottom interconnect structures 902 can be formed by a conformal deposition method, which can be, for example, chemical vapor deposition (CVD), atomic layer deposition (ALD), electroless plating, electroplating, combinations thereof, or any other suitable method. In some embodiments, there may be two bottom interconnect structures 902 coupled to each bottom metal routing 904. It is understood, that the number of bottom interconnect structures 902 coupled to each bottom metal routing 904 is not limited to two and can be any suitable number (e.g., 1, 3, 4, 5, 6, 7, etc.).

Figure 10:
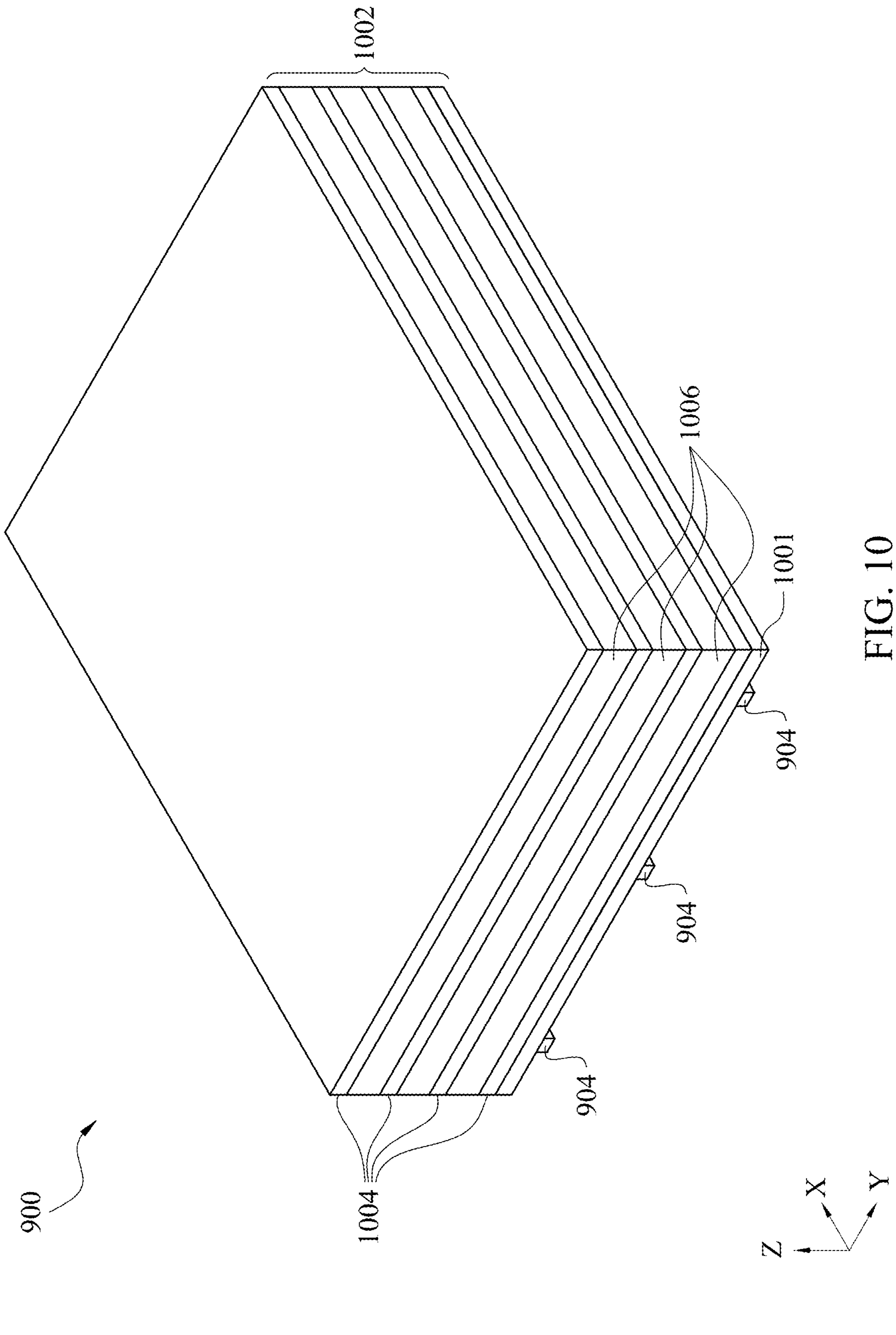

Corresponding to operation 804 of FIG. 8, FIG. 10 is a perspective view of the 3D memory device test structure 900 including a stack 1002 formed over a substrate 1001 disposed above the bottom metal routings 904 and the bottom interconnect structures 902, at one of the various stages of fabrication, in accordance with various embodiments.

The semiconductor substrate 1001 may be a semiconductor substrate, such as a bulk semiconductor, a semiconductor-on-insulator (SOI) substrate, or the like, which may be doped (e.g., with a p-type or an n-type dopant) or undoped. The substrate 1001 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 1001 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof, or any other suitable material.

The stack 1002 includes a number of insulating layers 1004 and a number of sacrificial layers 1006 alternately stacked on top of one another over the substrate 1001 along a vertical direction (e.g., the Z direction). Although four insulating layers 1004 and three sacrificial layers 1006 are shown in the illustrated embodiment of FIG. 10, it should be understood that the stack 1002 can include any number of insulating layers and any number of sacrificial layers alternately disposed on top of one another, while remaining within the scope of the present disclosure. Further, although the stack 1002 directly contacts the substrate 1001 in the illustrated embodiment of FIG. 10, it should be understood that the stack 1002 is separated from the substrate 1001. As used herein, the alternately stacked insulating layers 1004 and sacrificial layers 1006 refer to each of the sacrificial layers 1006 being adjoined by two adjacent insulating layers

1004. The insulating layers 1004 may have the same thickness thereamongst, or may have different thicknesses. The sacrificial layers 1006 may have the same thickness thereamongst, or may have different thicknesses. In some embodiments, the stack 1002 may begin with the insulating layer 1004 (as shown in FIG. 10) or the sacrificial layer 1006.

The insulating layers 1004 can include at least one insulating material. The insulating materials that can be employed for the insulating layer 1004 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 1004 can be silicon oxide.

The sacrificial layers 1006 may include an insulating material, a semiconductor material, or a conductive material. The material of the sacrificial layers 1006 is a sacrificial material that can be subsequently removed selective to the material of the insulating layers 1004. Non-limiting examples of the sacrificial layers 1006 include silicon nitride, an amorphous semiconductor material (such as amorphous silicon), and a polycrystalline semiconductor material (such as polysilicon). In one embodiment, the sacrificial layers 1006 can be spacer material layers that include silicon nitride or a semiconductor material including at least one of silicon or germanium.

The stack 1002 can be formed by alternately depositing the respective materials of the insulating layers 1004 and sacrificial layers 1006 over the substrate 1001. In some embodiments, one of the insulating layers 1004 can be deposited, for example, by chemical vapor deposition (CVD), followed by depositing, for example, using CVD or atomic layer deposition (ALD), one of the sacrificial layers 1006.

Figure 11:
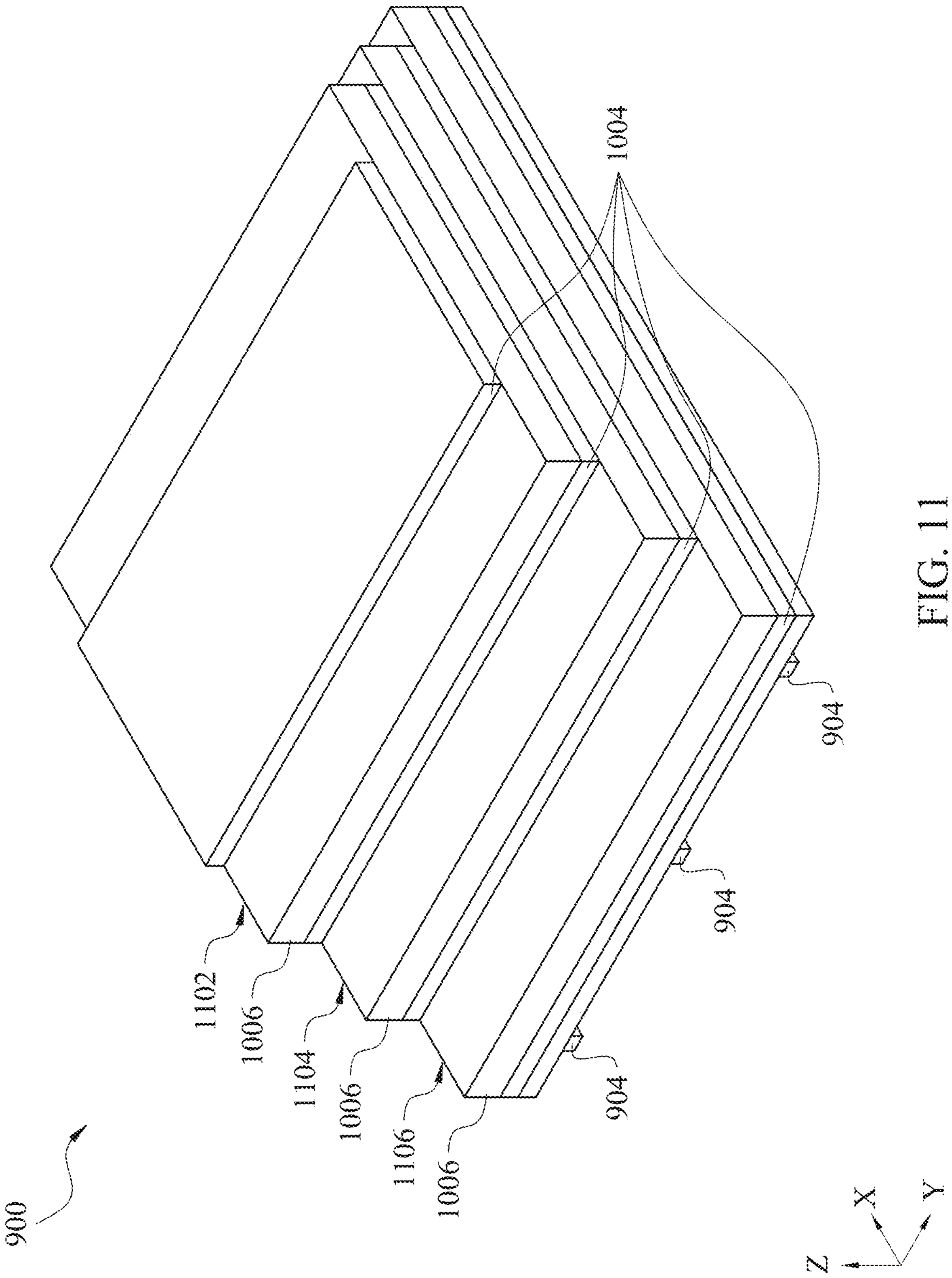

Corresponding to operation 806 of FIG. 8, FIG. 11 is a perspective view of the 3D memory device test structure 900 in which the stack 1002 is patterned to form a staircase profile at one of the various stages of fabrication, in accordance with various embodiments.

To form the staircase profile, a mask layer (not shown) is deposited on the stack (on the topmost insulating layer 1004), and is patterned. In some embodiments, the mask layer may include a photoresist (e.g., a positive photoresist or a negative photoresist), for example, a single layer or multiple layers of the same photoresist or different photoresists. In other embodiments, the mask layer may include a hard mask layer, for example, a polysilicon mask layer, a metallic mask layer, or any other suitable mask layer.

Next, the mask layer is patterned to etch portions of the mask layer at axial ends off the mask layer in the X-direction, for example, so as to reduce its axial width. The mask layer may be patterned using photolithography techniques. Generally, photolithography techniques utilize a photoresist material that forms the mask layer and that is deposited, irradiated (exposed), and developed to remove a portion of the photoresist material, in this instance, end portions of the mask layer. The remaining mask layer protects the underlying material, such as a portion of the stack 1002 below the patterned mask layer, from subsequent processing steps, such as etching.

Next, respective portions of the topmost insulating layer 1004 and the topmost sacrificial layer 1006 on both sides of the mask layer in the X-direction, are etched. For example, the patterned mask layer is used to etch the exposed portions of the topmost insulating layer 1004 and the topmost sacrificial layer 1006 so as to form a first step (or stair) 1102 (out of the topmost insulating layer 1004 and the sacrificial layer 1006) over the next lower insulating layer 1004 and sacrificial layer 1006 (i.e., the second topmost insulating layer 1004 and sacrificial layer 1006). In some embodiments, the etch may be an anisotropic etch (e.g., a reactive ion etch (RIE), neutral beam etch (NBE), deep reactive ion etch (DRIE), and the like, or combinations thereof,) which selectively etches the exposed portions of the topmost insulating layer 1004 and sacrificial layers 1006.

In some embodiments, the etching may include a first etch that selectively etches the topmost insulating layer 1004 until the underlying (e.g., topmost) sacrificial layer 1006 is exposed, and a second subsequent etch that etches the sacrificial layer 1006 until the underlying (e.g., second topmost) insulating layer 1004 is exposed. Such two-step etching process may allow the underlying sacrificial layer or the insulating layer to serve as a etch stop such that once a portion of the layer immediately above it has been removed, so as to prevent over-etching.

Next, the mask layer is again etched to reduce its axial width in the X-direction, followed by the two-step etching process to form a second step 1104 (out of the second topmost insulating layer 1004 and sacrificial layer 1006). By iteratively performing the width reduction process on the mask layer and the two-step etching process, the stack 1002 can be patterned to include a number of steps (e.g., steps 1102, 1104, and 1106), which results in the staircase profile as shown in FIG. 11.

Figure 12:
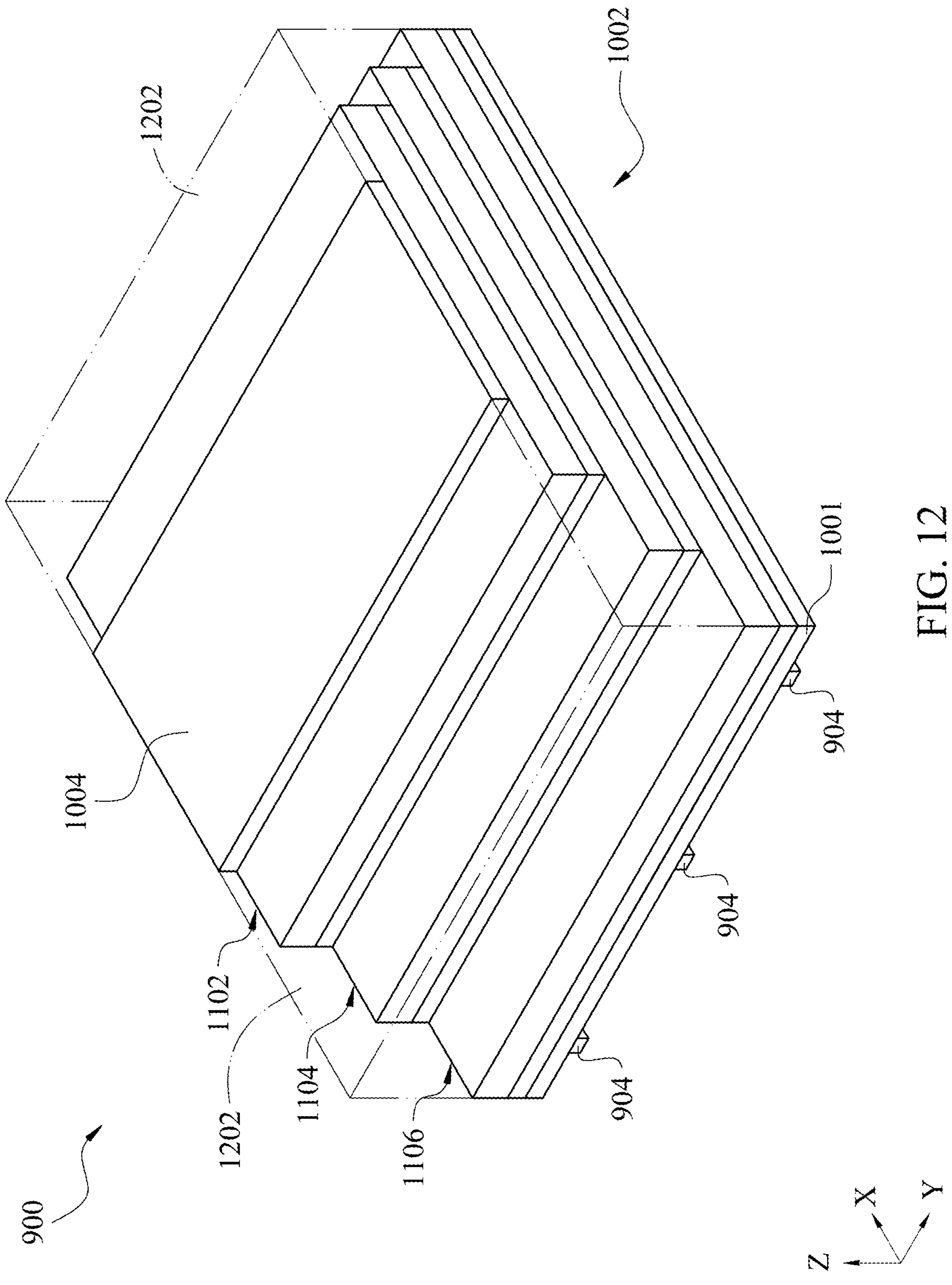

Corresponding to operation 808 of FIG. 8, FIG. 12 is a perspective view of the 3D memory device test structure 900 including an IMD 1202 formed over the stack 1002 (having the staircase profile) at one of the various stages of fabrication, in accordance with various embodiments.

The IMD 1202 can be formed by depositing a dielectric material in bulk over the partially formed 3D memory device test structure 900, and polishing the bulk oxide back (e.g., using CMP) to the level off the topmost insulating layer 1004, such that the IMD 1202 is disposed only over the steps 1102 to 1106. The dielectric material of the IMD 1202 may include SiO, phosphosilicate glass (PSG), borosilicate glass (BSG), boron-doped phosphosilicate glass (BPSG), undoped silicate glass (USG), combinations thereof, or any other suitable material.

Figure 13:
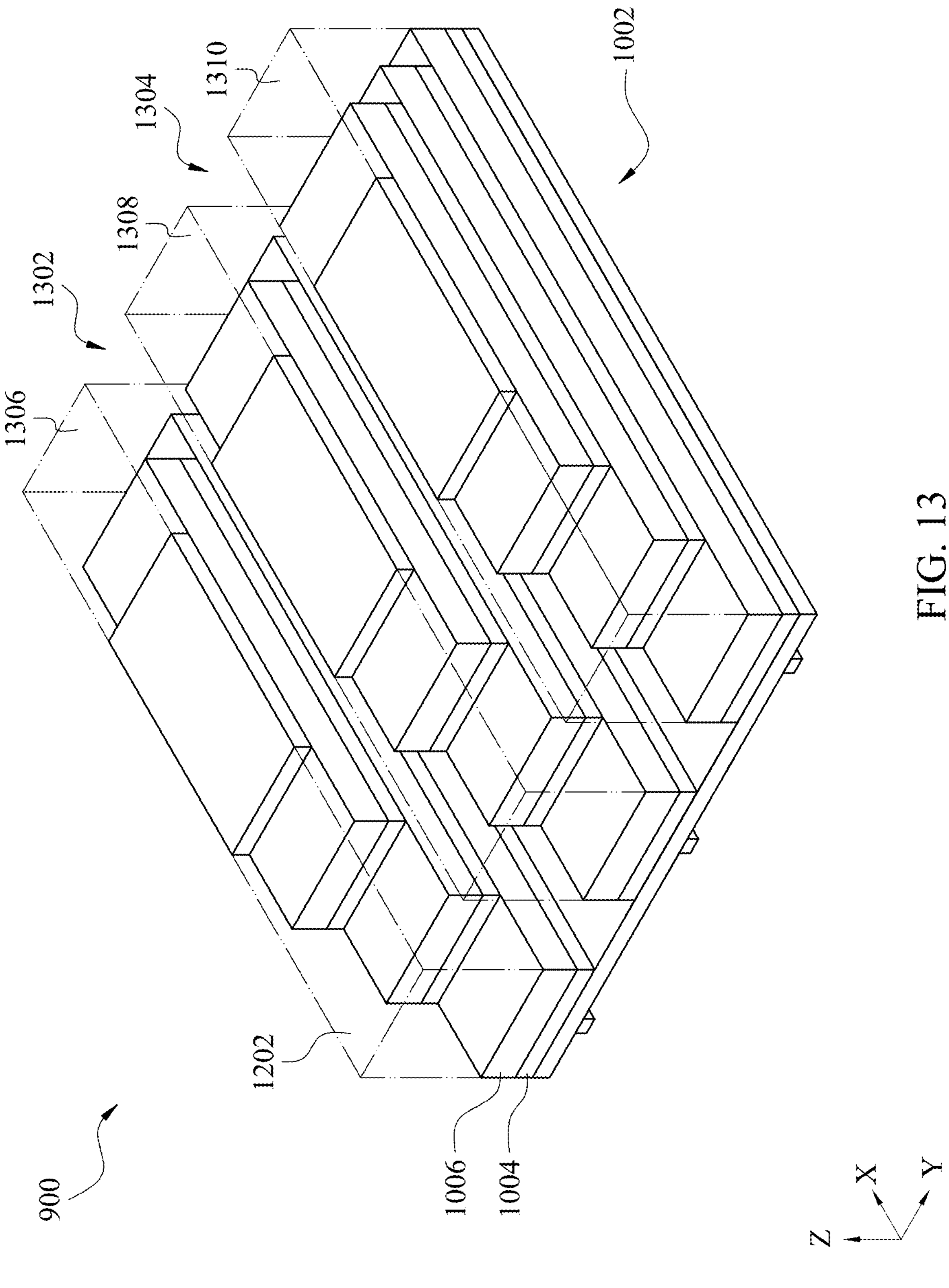

Corresponding to operation 810 of FIG. 8, FIG. 13 is a perspective view of the 3D memory device test structure 900 including a number of WL trenches 1302 and 1304 at one of the various stages of fabrication, in accordance with various embodiments.

Although two WL trenches 1302-1304 are shown in the illustrated embodiment of FIG. 13, it should be understood that the 3D memory device test structure 900 can include any number of WL trenches, while remaining within the scope of the present disclosure. The WL trenches 1302 and 1304 both extend along a lateral direction (e.g., the X direction). The WL trenches 1302 and 1304 can be formed using one or more etching processes. The etching processes may each include, for example, a reactive ion etch (RIE) process, a neutral beam etch (NBE) process, combinations thereof, or any other suitable process. The etching processes may be anisotropic.

As a result of forming the WL trenches 1302 and 1304, fin-like structures 1306, 1308, and 1310 are formed. As shown, the fin-like structures 1306 to 1310 (sometimes referred to as stripe structures) all extend along a lateral direction (e.g., the X direction), and are in parallel with one another. Each of the fin-like structures 1306 to 1310 includes a number of layers (or tiers) alternately stacked on top of one another. In particular, each fin-like structure includes an alternate stack of a number of (remaining portions of) the insulating layers 1004, a number of (remaining portions of) the sacrificial layers 1006, and a remaining portion of the IMD 1202.

Figure 14:
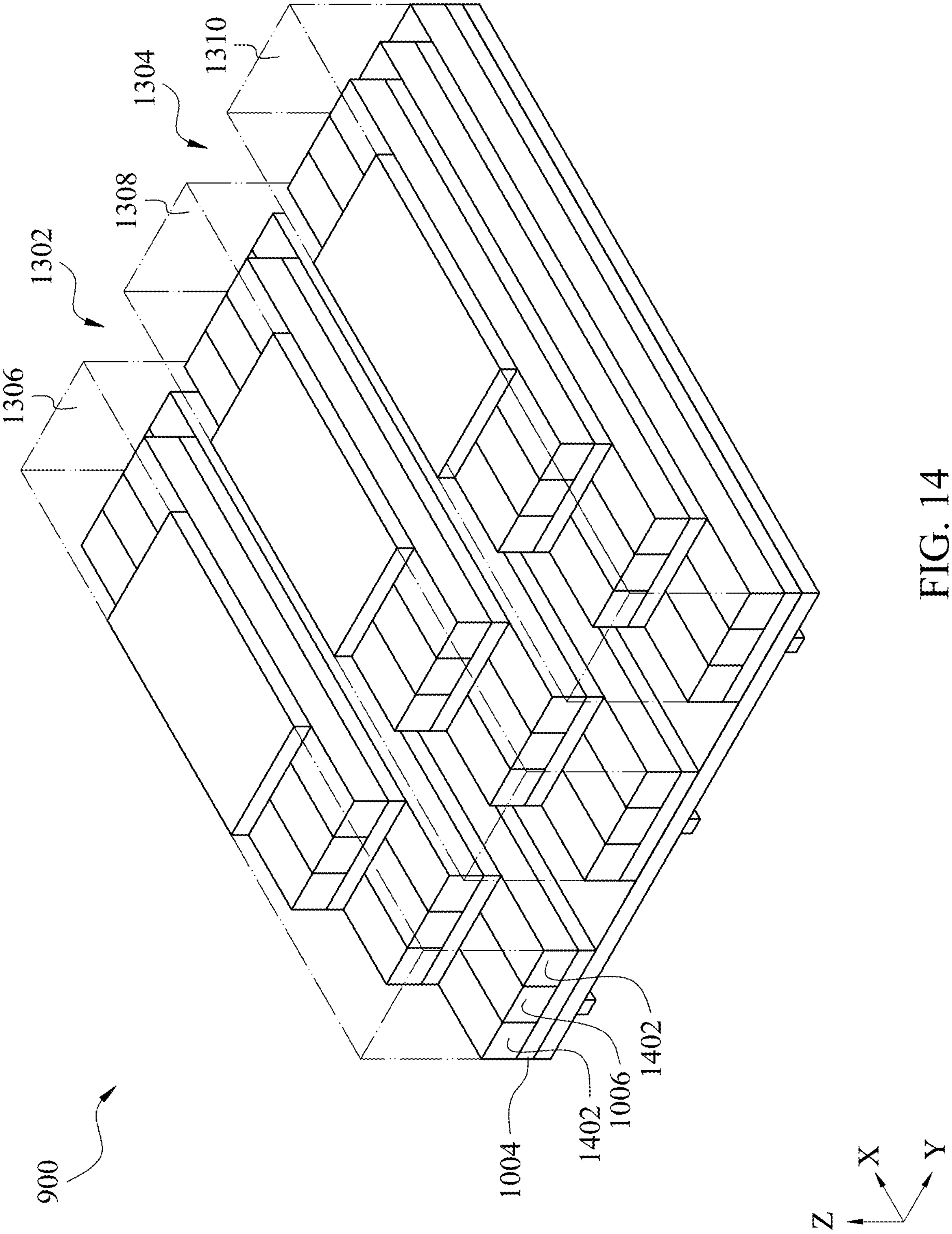

Corresponding to operation 812 of FIG. 8, FIG. 14 is a perspective view of the 3D memory device test structure 900 including a number of WLs 1402 at one of the various stages of fabrication, in accordance with various embodiments.

To form the WLs 1402, respective end portions of each of the sacrificial layers 1006 in each of the fin-like structures 1306 to 1310 may be laterally recessed (e.g., along the Y direction). The sacrificial layers 1006 can be recessed by performing an etching process that etches the sacrificial layers 1006 selective to the insulating layers 1004 through the WL trenches 1302 and 1304. Alternatively stated, the insulating layers 1004 may remain substantially intact throughout the selective etching process. In some embodiments, each of the sacrificial layers 1006 may be inwardly recessed from its both ends (along the Y direction) with a certain etch-back distance. Such an etch-back distance can be controlled to be less than one half the width of the sacrificial layer 1006 along the Y direction, so as to remain a central portion of the sacrificial layers 1006 intact, as shown in FIG. 14.

The etching process can include a wet etching process employing a wet etch solution, or can be a gas phase (dry) etching process in which the etchant is introduced in a vapor phase into the first trenches (dotted lines). In the example where the sacrificial layers 1006 include silicon nitride and the insulating layers 1004 include silicon oxide, the etching process can include a wet etching process in which the workpiece is immersed within a wet etch tank that includes phosphoric acid, which etches silicon nitride of the sacrificial layer 1006 selective to silicon oxide, silicon, and various other materials of the insulating layers 1004.

Figure 15:
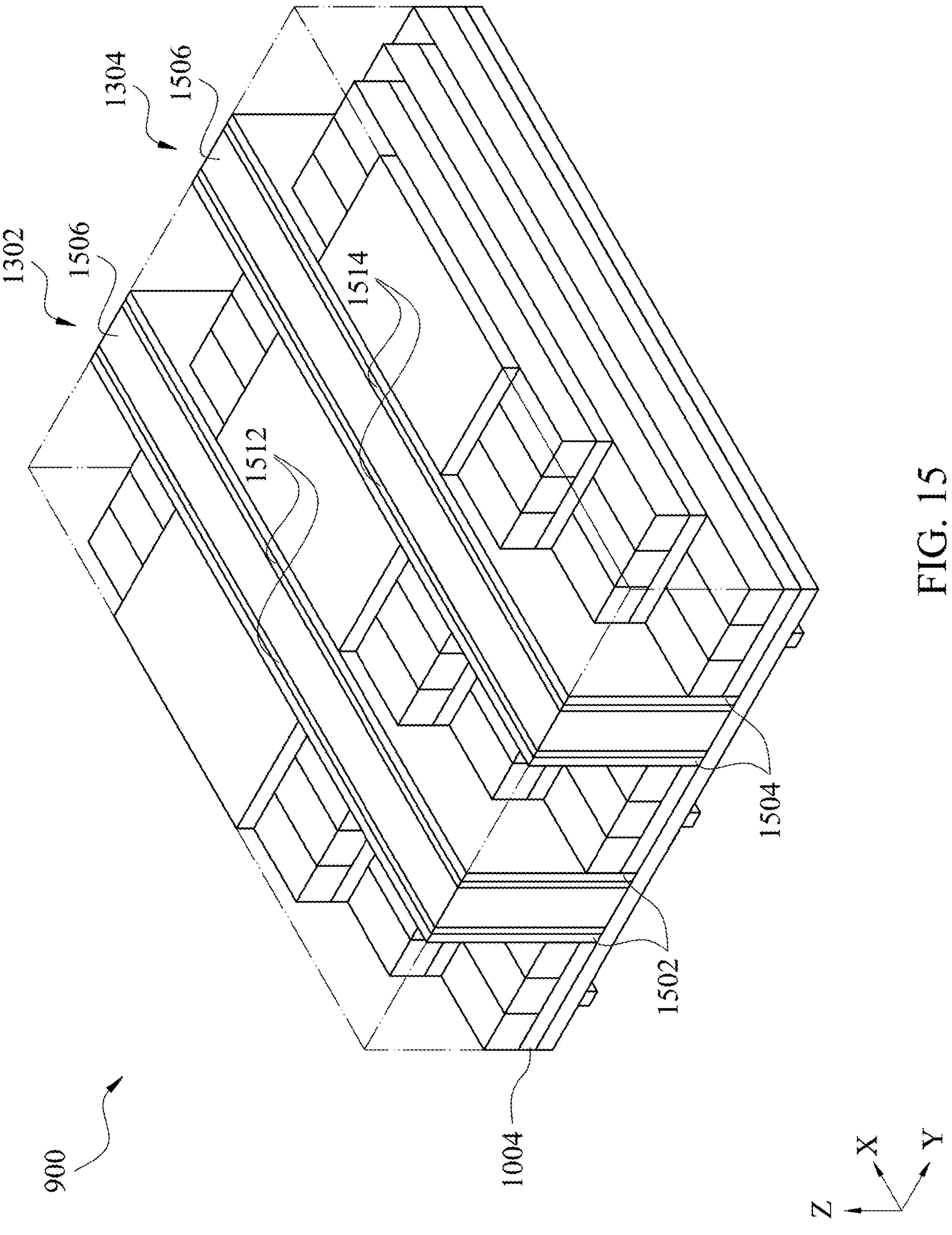

Next, a metallic fill layer can be (e.g., conformally) formed to fill the "recesses" inwardly extending toward the remaining sacrificial layer 906 with respect to the insulating layer 1004, thereby forming the WLs 1402, as shown in FIG. 14. The metallic fill layer includes at least one metal material such as, but not limited to, tungsten, copper, cobalt, ruthenium, titanium, tantalum, combinations thereof, or any other suitable material. The metallic fill layer can be deposited by a conformal deposition method, which can be, for example, chemical vapor deposition (CVD), atomic layer deposition (ALD), electroless plating, electroplating, combinations thereof, or any other suitable method. Corresponding to operation 814 of FIG. 8, FIG. 15 is a perspective view of the 3D memory device test structure 900 including a number of memory layers 1502, 1504 and a number of channel layers 1512, 1514 at one of the various stages of fabrication, in accordance with various embodiments.

In various embodiments, each of the memory layers 1502-1504 includes two portions, each of which is formed to extend along one of the sidewalls of a corresponding trench. As such, each portion of the memory layer is in contact with a corresponding number of WLs (through their respective exposed sidewalls). Over the memory layer, each of the channel layers 1512-1514 also includes two portions that are in contact with the two portions of a corresponding memory layer, respectively. As shown in the illustrated example of FIG. 15, the memory layer 1502, including two portions, and the channel layer 1512, including two portions, are formed in the trench 1302; and the memory layer 1504, including two portions, and the channel layer 1514, including two portions, are formed in the trench 1304.

Each of the memory layers 1502-1504, disposed along sidewalls of each of the WL trenches 1302-1304, may include a ferroelectric material, for example, lead zirconate titanate (PZT), $PbZr/TiO_3$, $BaTiO_3$, $PbTiO_2$, etc. However, it should be understood that the memory layers 1502-1504 may each include a charge storage layer, while remaining within the scope of the present disclosure. The memory layers 1502-1504 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layers are each continuous around the sidewalls of the WL trench.

Each of the channel layers 1512-1514 is formed on radially inner surfaces (sidewalls) of the memory layer. In some embodiments, the channel layers 1512-1514 may each be formed from a semiconductor material, for example, Si (e.g., polysilicon or amorphous silicon), Ge, SiGe, silicon carbide (SiC), etc. The channel layers 1512-1514 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the channel layers 1512-1514 are each continuous on the radially inner surfaces of the memory layer.

Each of the WL trenches 1302-1304 is then filled with an insulating material (e.g., SiO, SiN, SiON, SiCN, SiC, SiOC, SiOCN, any other suitable material, combinations thereof) so as to form the inner spacer 1506. In some embodiments, the inner spacer 1506 may be formed from the same material as the plurality of insulating layers 1004. The inner spacer 1506 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof.

Figure 16:
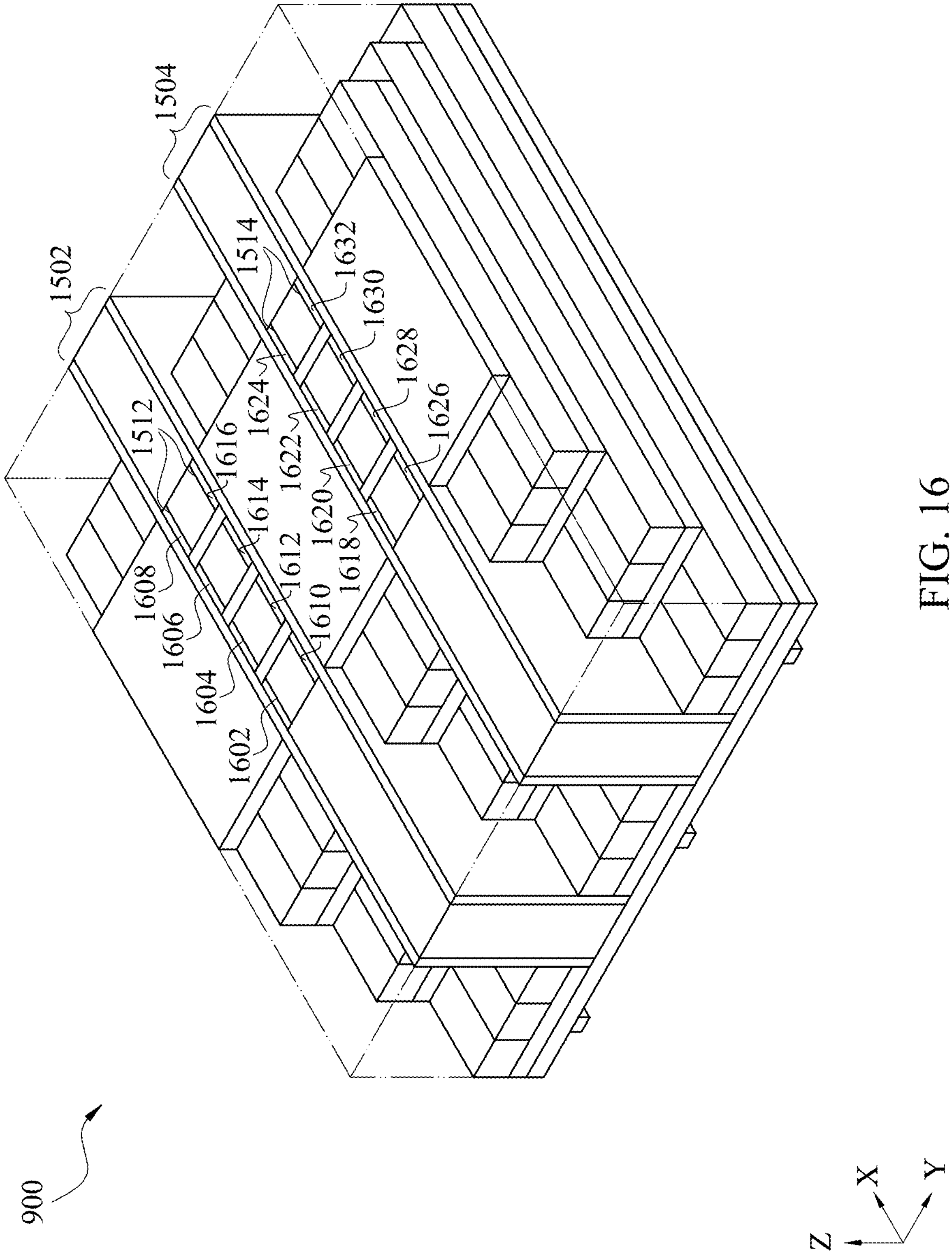

Corresponding to operation 816 of FIG. 8, FIG. 16 is a perspective view of the 3D memory device test structure 900 in which the channel layers 1512 and 1514 are each patterned at one of the various stages of fabrication, in accordance with various embodiments.

In some embodiments, each of the channel layers 1512 and 1514 is patterned into a number of segments, each of which can define the initial footprint of a memory string. For example, the channel layer 1512 is patterned into discrete segments 1602, 1604, 1606, 1608, 1610, 1612, 1614, and 1616; and the channel layer 1514 is patterned into discrete segments 1618, 1620, 1622, 1624, 1626, 1628, 1630, and 1632. Each of such channel segments can serve as the channel of a memory string that includes a number of memory cells disposed across multiple tiers. Hereinafter, channel segments 1602 to 1632 are referred to as "memory strings 1602 to 1632." The segments are electrically isolated from one another by refilling an insulating material (e.g., SiO, SiN, SiON, SiCN, SiC, SiOC, SiOCN, any other suitable material, or combinations thereof).

Figure 17:
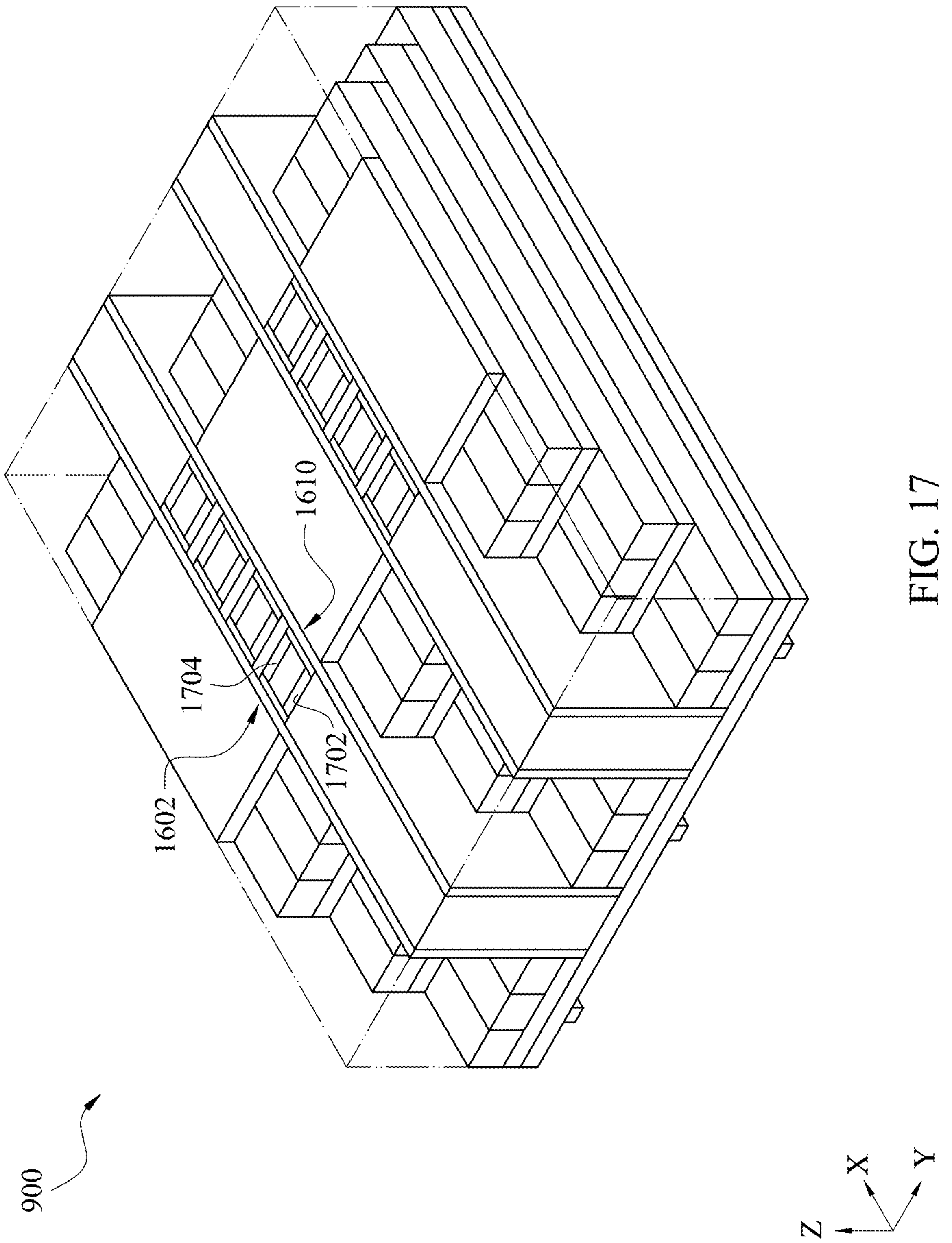

Corresponding to operation 818 of FIG. 8, FIG. 17 is a perspective view of the 3D memory device test structure 900 including a number of BLs 1702 and a number of SLs 1704 at one of the various stages of fabrication, in accordance with various embodiments.

Figure 18:
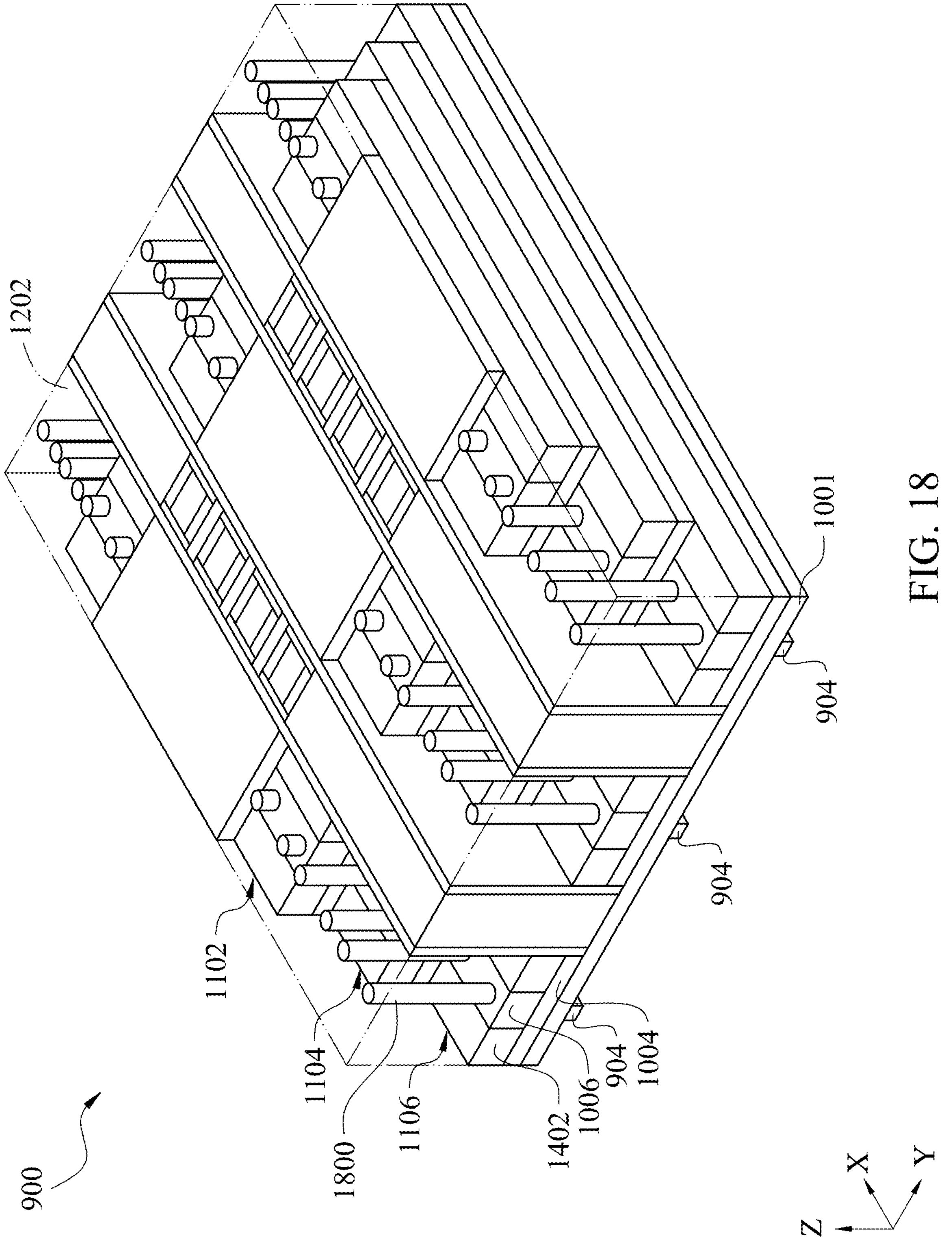

In some embodiments, each of the BLs 1702 and SLs 1704 is formed of a metallic fill material, and extends along the Z direction. Each of the channel segments (or memory strings) is coupled to a pair of BL and SL. Further, two memory strings in a WL trench that face to each other can share a pair of BL and SL. Using the memory strings 1602 and 1610 as a representative example, the memory strings 1602 and 1610 share the vertically extending BL 1702 and SL 1704. The metallic fill layer includes at least one metal material such as, but not limited to, tungsten, copper, cobalt, ruthenium, titanium, tantalum, combinations thereof, or any other suitable material. The metallic fill layer can be deposited by a conformal deposition method, which can be, for example, chemical vapor deposition (CVD), atomic layer deposition (ALD), electroless plating, electroplating, combinations thereof, or any other suitable method. Corresponding to operation 820 of FIG. 8, FIG. 18 is a perspective view of the 3D memory device test structure 900 including a number of test interconnect structures 1800 at one of the various stages of fabrication, in accordance with various embodiments.

Figure 19:
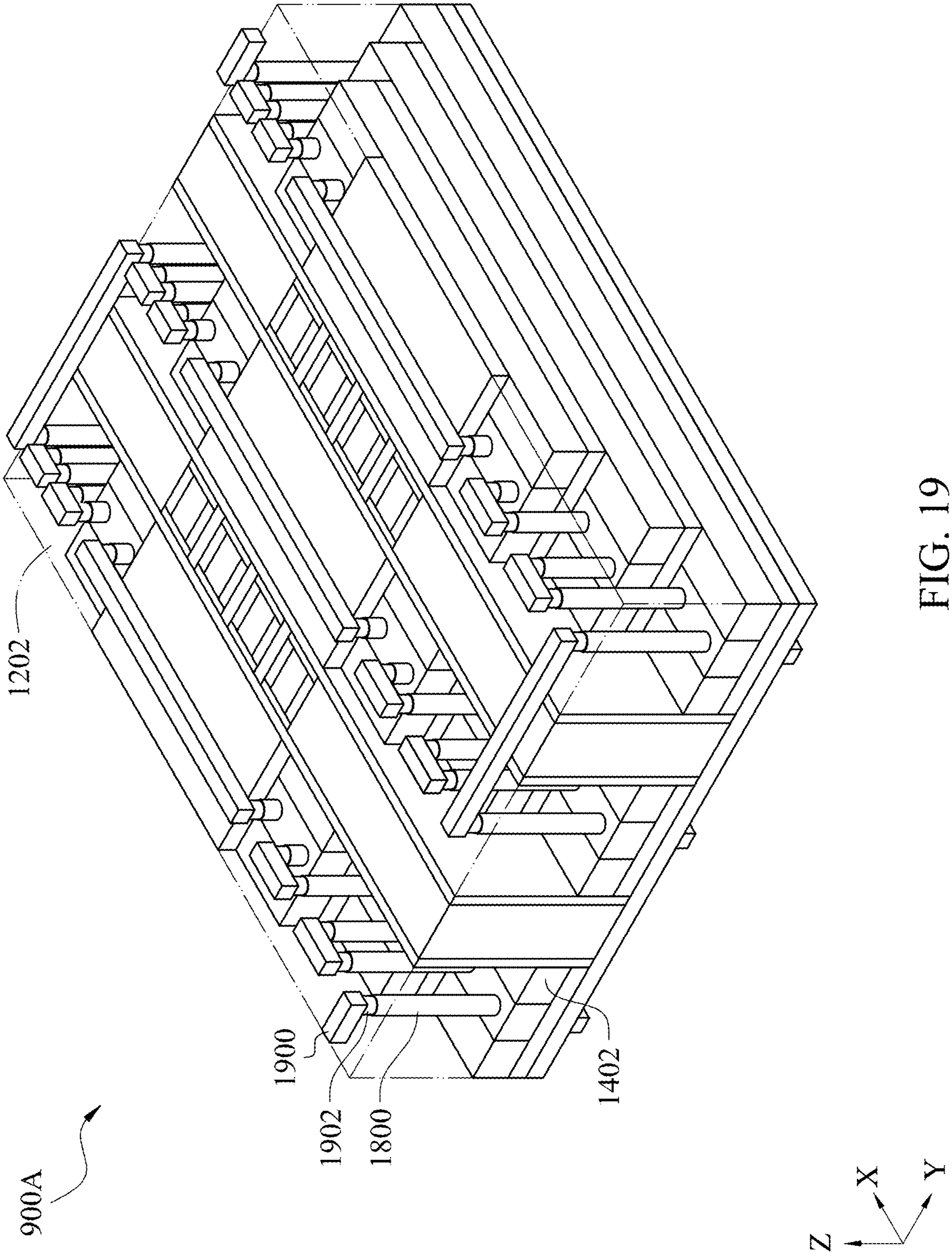
FIG. 19 illustrates a perspective view of the three-dimensional memory device test structure of FIGS. 9-18, in accordance with some embodiments.

The test interconnect structures 1800 (substantially similar as the test interconnect structures 208A and 208B, as discussed above) each penetrate through the IMD 1202, the respective insulting layer(s) 1004, the respective sacrificial layer(s) 1006, and the substrate 1001 (i.e., the memory device test structure 900) to land on a bottom interconnect structure. For example in FIG. 18, a number of test interconnect structures 1800 vertically extends to land on the bottom interconnect structures (and respective bottom metal routings 904) through the first step 1102; a number of test interconnect structures 1800 vertically extend to land on the bottom interconnect structures (and respective bottom metal routings 904) through the second step 1104; and a number of test interconnect structures 1800 vertically extends to land on the bottom interconnect structures (and respective bottom metal routings 904) through the third step 1106. In some embodiments, the test interconnect structures 1800 all have the same height or substantially the same height as they extend through memory array. The test interconnect structures 1800 are formed by etching the IMD 1202, the respective insulating layer(s) 1004, the respective sacrificial layer(s) 1006, and the substrate 1001 to form a number of openings that expose the bottom interconnect structures 904, and then filled out with the openings with a metallic fill material. The metallic fill material includes at least one metal material such as, but not limited to, tungsten, copper, cobalt, ruthenium, titanium, tantalum, combinations thereof, or any other suitable material. The metallic fill material can be deposited by a conformal deposition method, which can be, for example, chemical vapor deposition (CVD), atomic layer deposition (ALD), electroless plating, electroplating, combinations thereof, or any other suitable method. Corresponding to operation 822 of FIG. 8, FIG. 19 is a perspective view of the 3D memory device test structure 900A (a first embodiment of the 3D memory device test structure 900) including a number of metal routings 1900 at one of the various stages of fabrication, in accordance with various embodiments.

The metal routings 1900 (substantially similar as the metal routings 210, as discussed above) electrically couple the test interconnect structures 1800 in series. Further, each of the metal routings 1900, formed as a horizontal conductive line, is coupled to a respective test interconnect structure through a top via 1902 (e.g., top interconnect structure), formed as a vertical conductive line. Such metal routings 1900 and top vias 1902 may be formed through a dual-damascene or single-damascene process by forming one or more horizontal and vertical trenches extending through another IMD over the IMD 1202, and filling those trenches with a metallic fill material. The metallic fill material includes at least one metal material such as, but not limited to, tungsten, copper, cobalt, ruthenium, titanium, tantalum, combinations thereof, or any other suitable material. The metallic fill material can be deposited by a conformal deposition method, which can be, for example, chemical vapor deposition (CVD), atomic layer deposition (ALD), electroless plating, electroplating, combinations thereof, or any other suitable method. In the illustrated examples of FIG. 14 (and FIGS. 15-19), the recesses are each formed with an edge-based sidewall (e.g., a nearly vertical sidewall), which causes the WLs 1402 to follow such an edge-based inner sidewall. Alternatively stated, an edge-based interface is formed between the remaining central sacrificial layers 1006 and the WL 1402. However, the recessed may be formed to have a curvature-based sidewall, which causes the WLs 1402 to follow such a curvature-based inner sidewall.

In some embodiments, the top via 1902 and metal routing 1900 are formed with a width (extending along the Y direction) less than a width of the test interconnect structure 1800 (extending along the Y direction). The top via 1902 may have a bottom surface aligned with a top surface of the test interconnect structure 1800; the top via 1902 may have a bottom surface below a top surface of the test interconnect structure; the top via 1902 and the test interconnect structure 1800 may be centrally aligned with each other; or the top via 1902 and the test interconnect structure 1800 may be centrally misaligned with each other.

Also corresponding to operation 824 of FIG. 8, FIGS. 20A-20C are perspective views of the 3D memory device test structure 900B (a second embodiment of the 3D memory device test structure 900) including a number of metal routings 1900, in accordance with various embodiments.

Figure 20A:
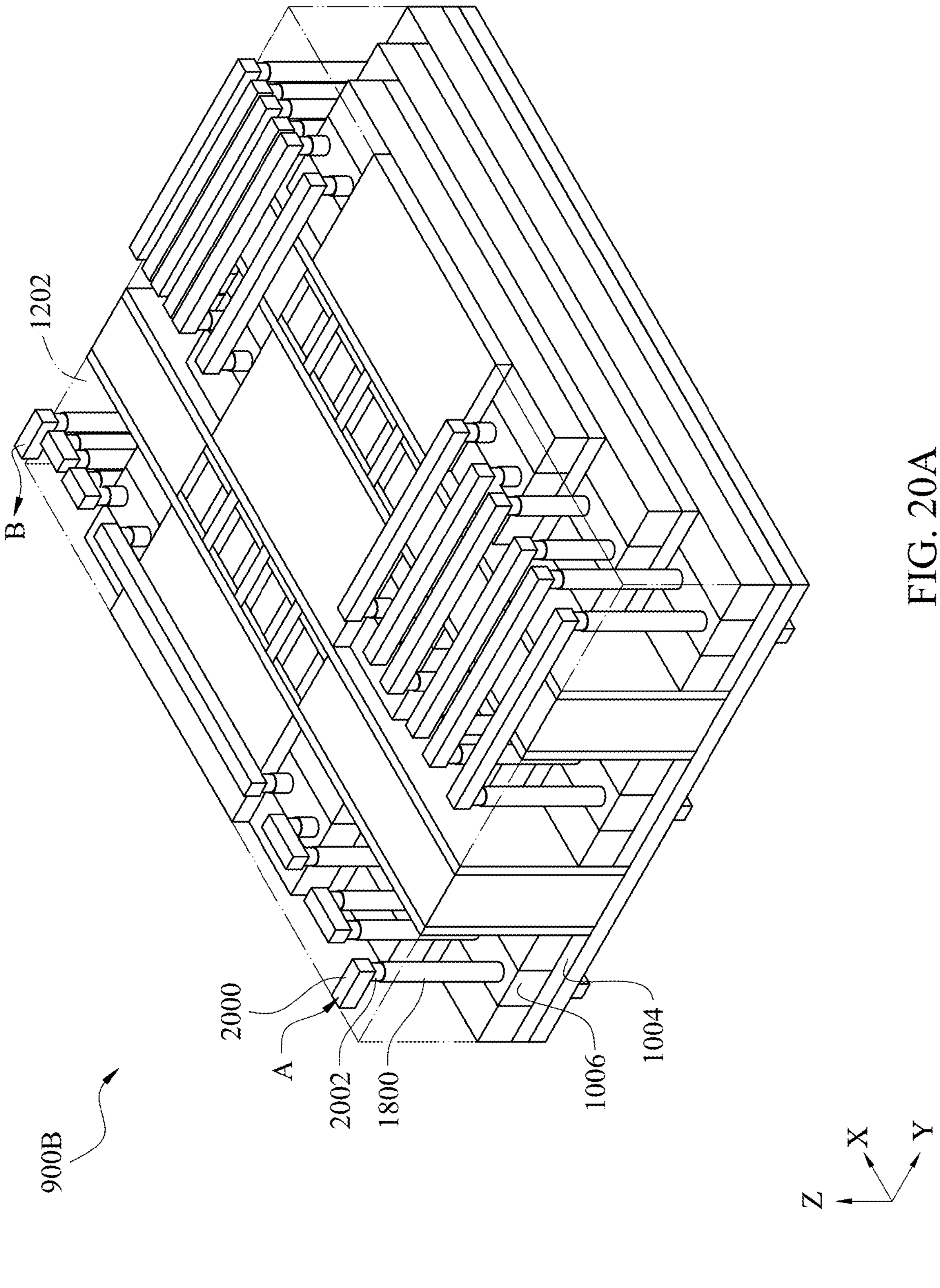
FIGS. 20A-C illustrate perspective views of various components of the three-dimensional memory device test structure of FIGS. 9-18, in accordance with some embodiments.
Figure 20B:
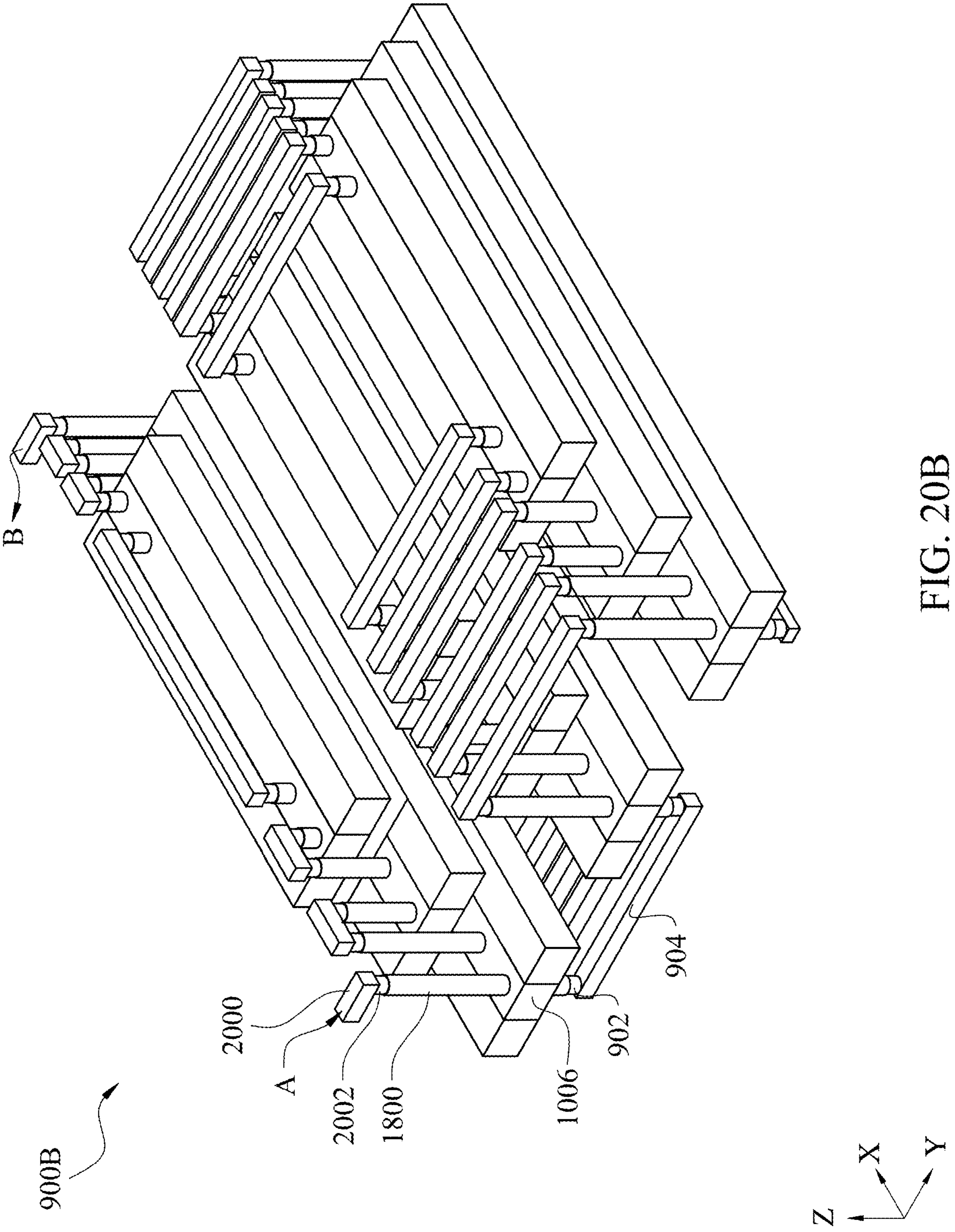
Figure 20C:
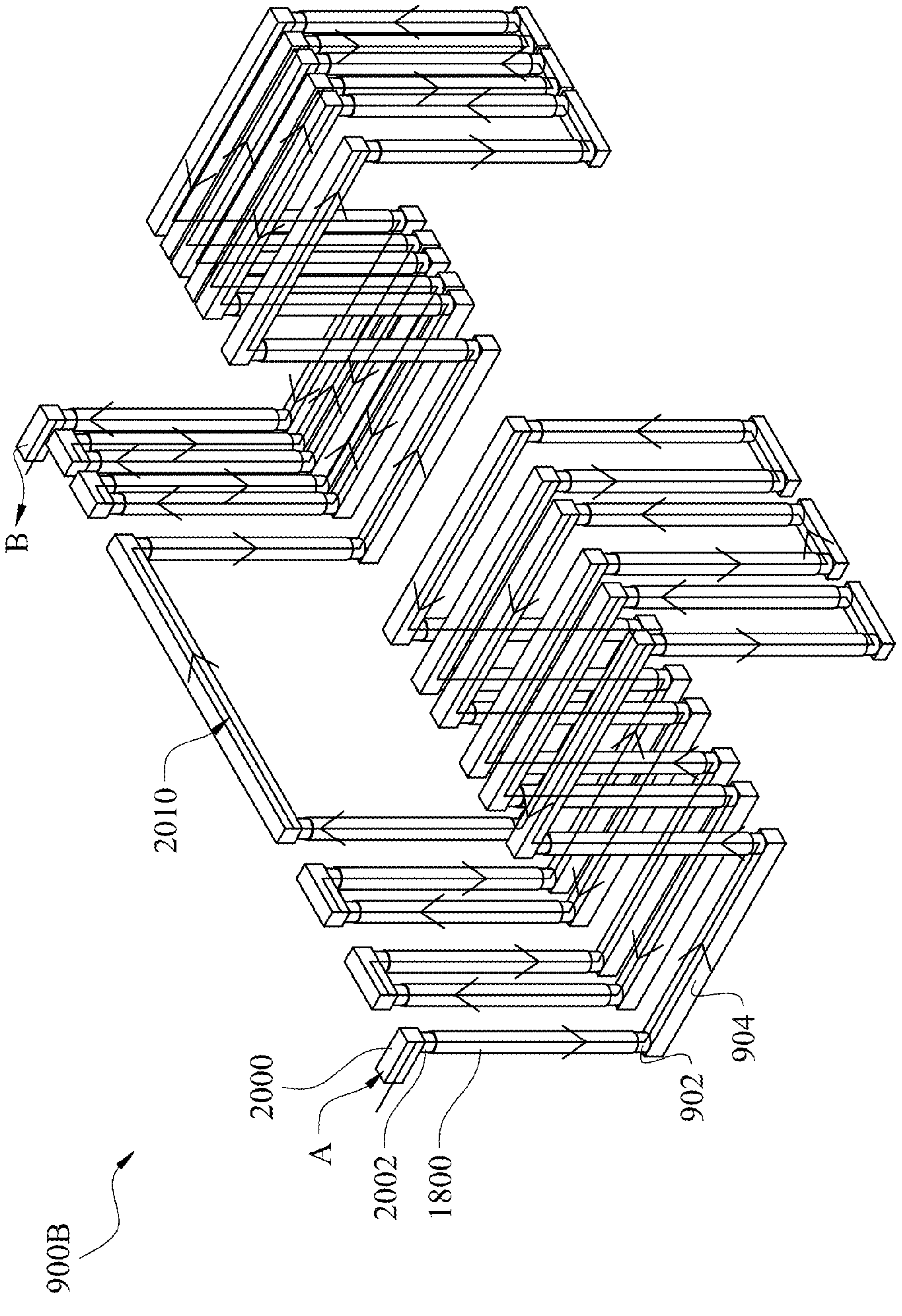

The metal routings 2000 electrically couple the test interconnect structures 1800 in series. The metal routings 2000 are similar to the metal routings 1900 but are formed in to direct the electrical current through a different conduction path. Each of the metal routings 2000, formed as a horizontal conductive line, is coupled to a respective test interconnect structure through a top via, 2002, formed as a vertical conductive line. Such metal routings 2000 and top vias 2002 may be formed through a dual-damascene or single-damascene process by forming one or more horizontal and vertical trenches extending through another IMD over the IMD 1202, and filling those trenches with a metallic fill material, as shown in FIG. 20A. The metallic fill material includes at least one metal material such as, but not limited to, tungsten, copper, cobalt, ruthenium, titanium, tantalum, combinations thereof, or any other suitable material. The metallic fill material can be deposited by a conformal deposition method, which can be, for example, chemical vapor deposition (CVD), atomic layer deposition (ALD), electroless plating, electroplating, combinations thereof, or any other suitable method. FIG. 20B and FIG. 20C illustrate perspective views of the metal routings 2000 and the top vias 2002 with various components of the 3D memory device test structure 900B. FIG. 20C illustrates a conduction path 2010 formed by using the metal routings 2000 and top vias 2002 to serially connecting the test interconnect structures 1800 to the test bottom interconnect structures 902 and bottom metal routings 904. A first signal (e.g., a voltage signal) may be applied to one end of the 3D memory device test structure 900B (arrow "A" indicated in FIG. 20C), the level of a second signal (e.g., a current signal) detected on the other end of the 3D memory device test structure 900B (arrow "B" indicated in FIG. 20C) can be used to determine whether one or more open circuits are present along the conduction path 2010. For example, if there is an open circuit present along the conduction path 2010, the level of the second signal may be lower than a threshold. The threshold can be pre-calibrated based on various process parameters (e.g., the resistivity of a material of the test interconnect structures 1800, a number of the test interconnect structures 1800, etc.). On the other hand, if there is no open circuit present, the level of the second signal should be equal to or greater than the threshold. The metal routings 2000 provide a different conduction path than the one formed from the metal routings 1900 (FIG. 19) and can therefore test the second interconnect structures of the tested memory block in a different manner.

Also corresponding to operation 824 of FIG. 8, FIGS. 21A-21C are perspective views of the 3D memory device test structure 900C (a third embodiment of the 3D memory device test structures 900) including a number of metal routings 2100, in accordance with various embodiments.

Figure 21A:
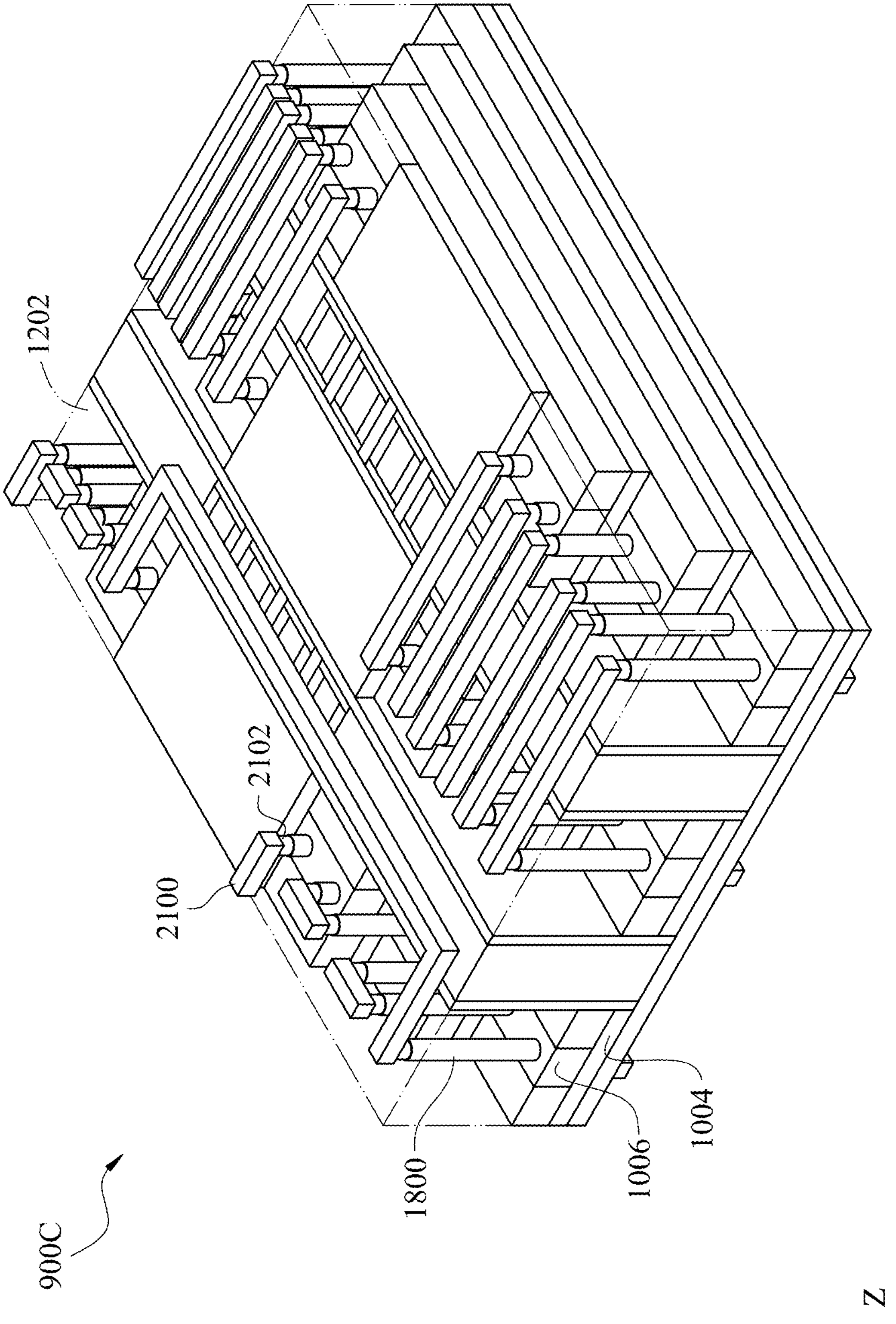
FIGS. 21A-C illustrate perspective views of various components of the three-dimensional memory device test structure of FIGS. 9-18, in accordance with some embodiments.
Figure 21B:
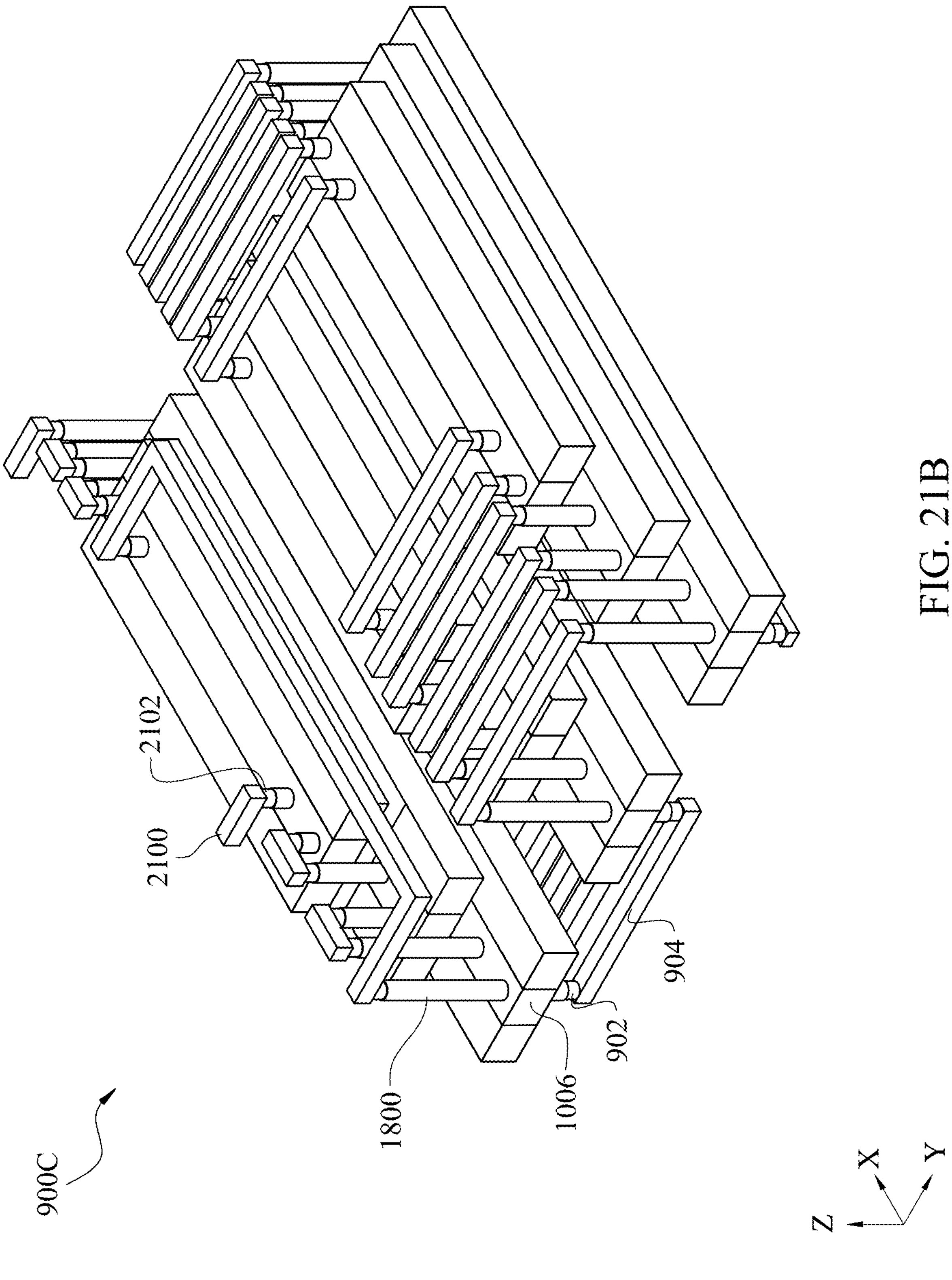
Figure 21C:
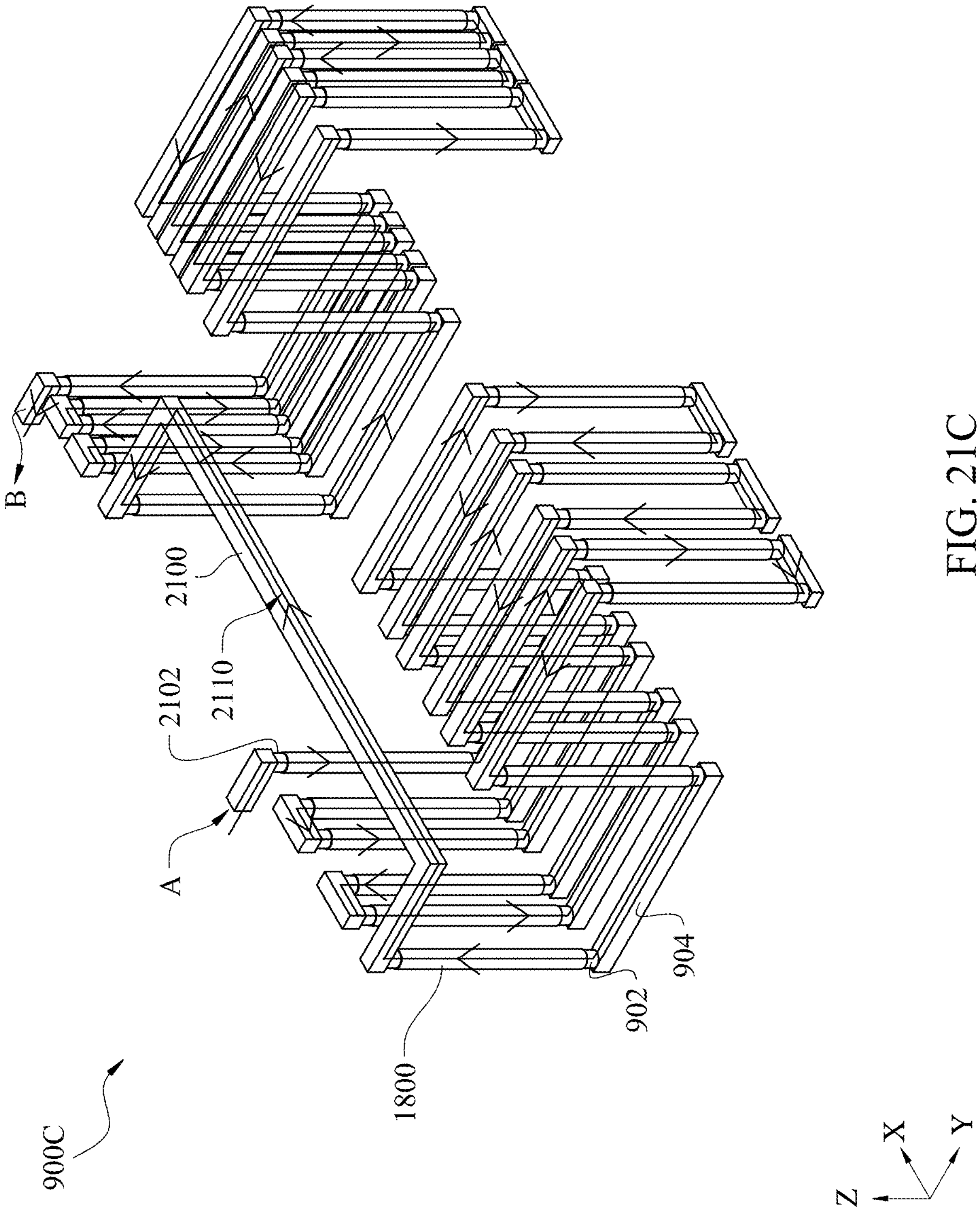

The metal routings 2100 electrically couple the test interconnect structures 1800 in series. The metal routings 2100 are similar to the metal routings 1900 but are formed in to direct the electrical current through a different conduction path. Each of the metal routings 2100, formed as a horizontal conductive line, is coupled to a respective test interconnect structure through a top via, 2102, formed as a vertical conductive line. Such metal routings 2100 and top vias 2102 may be formed through a dual-damascene or single-damascene process by forming one or more horizontal and vertical trenches extending through another IMD over the IMD 1202, and filling those trenches with a metallic fill material, as shown in FIG. 21A. The metallic fill material includes at least one metal material such as, but not limited to, tungsten, copper, cobalt, ruthenium, titanium, tantalum, combinations thereof, or any other suitable material. The metallic fill material can be deposited by a conformal deposition method, which can be, for example, chemical vapor deposition (CVD), atomic layer deposition (ALD), electroless plating, electroplating, combinations thereof, or any other suitable method. FIG. 21B and FIG. 21C illustrate perspective views of the metal routings 2100 and the top vias 2102 with various components of the 3D memory device test structure 900C. FIG. 21C illustrates a conduction path 2110 formed by using the metal routings 2100 and top vias 2102 to serially connecting the test interconnect structures 1800 to the test bottom interconnect structures 902 and bottom metal routings 904. A first signal (e.g., a voltage signal) may be applied to one end of the 3D memory device test structure 900C (arrow "A" indicated in FIG. 21C), the level of a second signal (e.g., a current signal) detected on the other end of the 3D memory device test structure 900C (arrow "B" indicated in FIG. 21C) can be used to determine whether one or more open circuits are present along the conduction path 2110. For example, if there is an open circuit present along the conduction path 2110, the level of the second signal may be lower than a threshold. The threshold can be pre-calibrated based on various process parameters (e.g., the resistivity of a material of the test interconnect structures 1800, a number of the test interconnect structures 1800, etc.). On the other hand, if there is no open circuit present, the level of the second signal should be equal to or greater than the threshold. The metal routings 2100 provide a different conduction path than the one formed from the metal routings 1900 (FIG. 19) and can therefore test the second interconnect structures of the tested memory block in a different manner.

Also corresponding to operation 824 of FIG. 8, FIGS. 22A-22C are perspective views of the 3D memory device test structure 900D (a third embodiment of the 3D memory device test structures 900) including a number of metal routings 2200, in accordance with various embodiments.

Figure 22A:
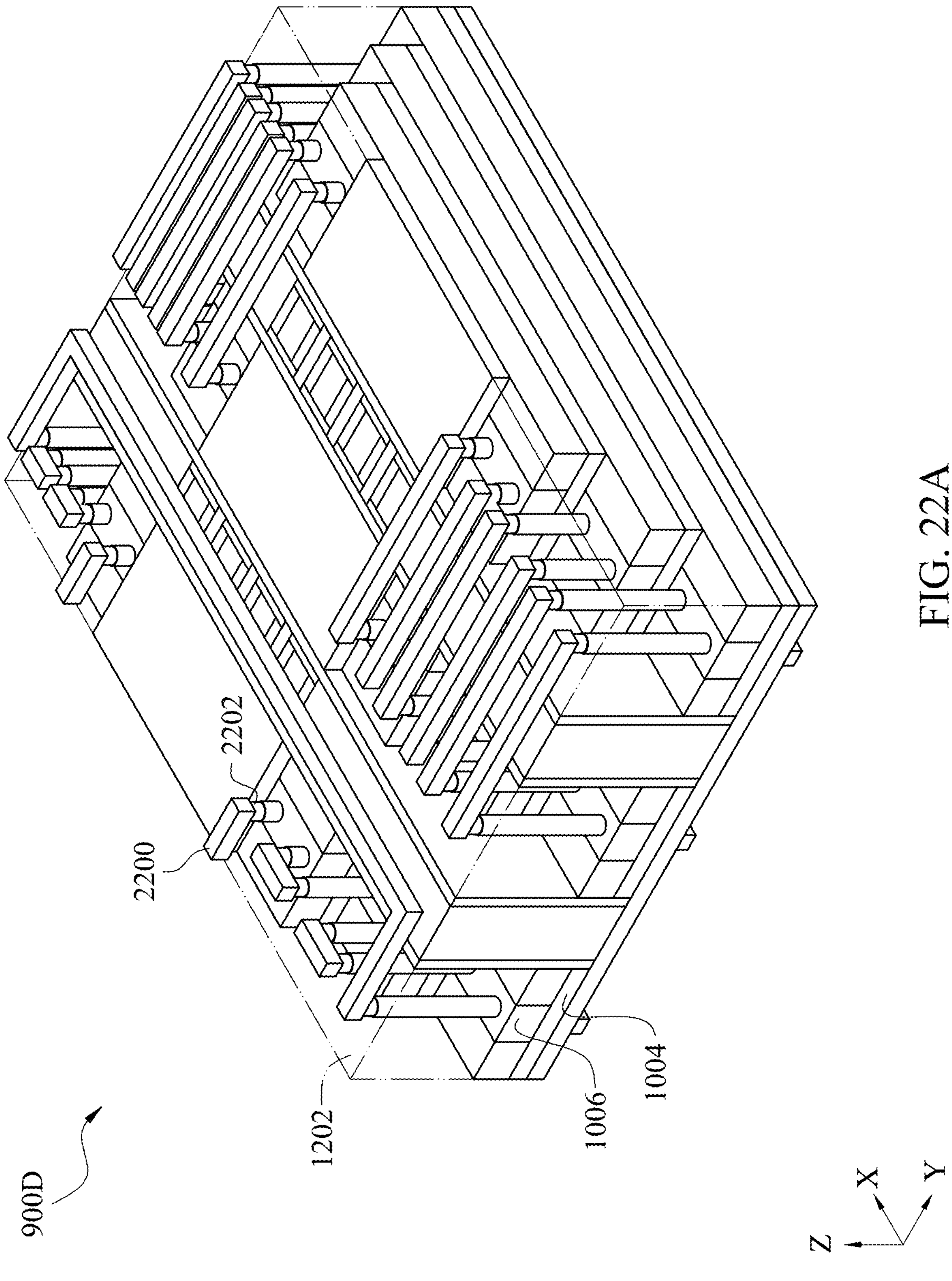
FIGS. 22A-C illustrate perspective views of various components of the three-dimensional memory device test structure of FIGS. 9-18, in accordance with some embodiments.
Figure 22B:
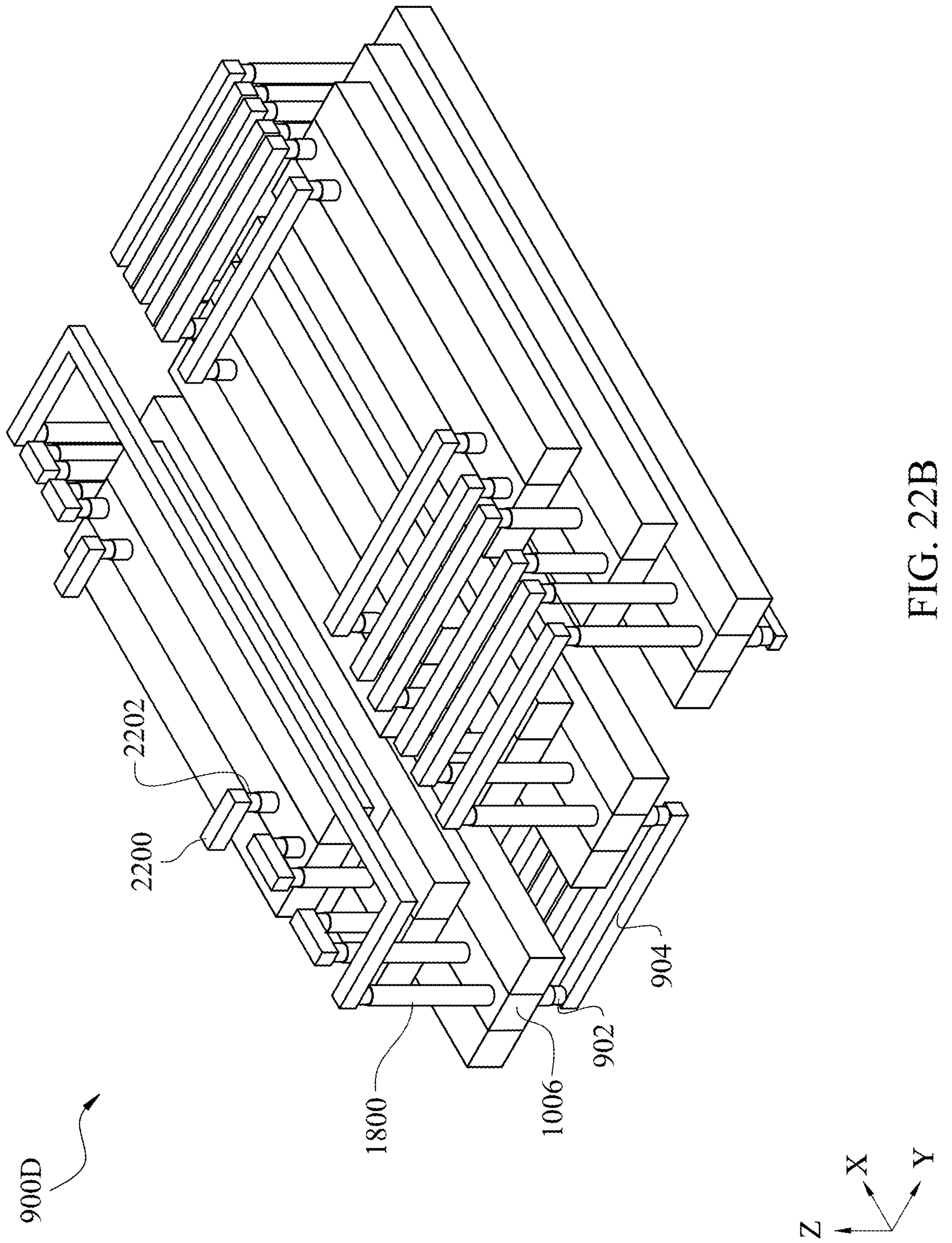
Figure 22C:
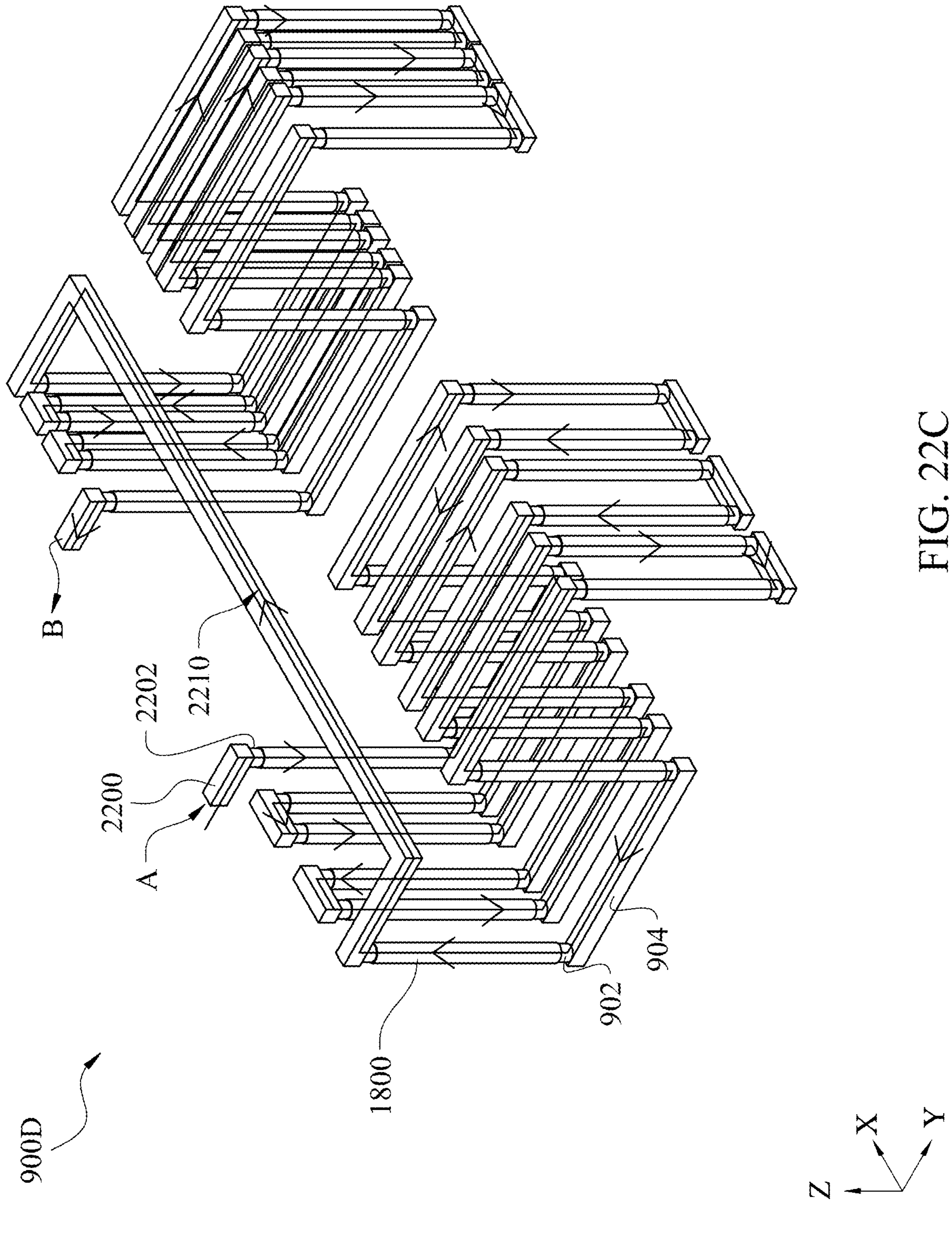

The metal routings 2200 electrically couple the test interconnect structures 1800 in series. The metal routings 2200 are similar to the metal routings 1900 but are formed in to direct the electrical current through a different conduction path. Each of the metal routings 2200, formed as a horizontal conductive line, is coupled to a respective test interconnect structure through a top via, 2202, formed as a vertical conductive line. Such metal routings 2200 and top vias 2202 may be formed through a dual-damascene or single-damascene process by forming one or more horizontal and vertical trenches extending through another IMD over the IMD 1202, and filling those trenches with a metallic fill material, as shown in FIG. 21A. The metallic fill material includes at least one metal material such as, but not limited to, tungsten, copper, cobalt, ruthenium, titanium, tantalum, combinations thereof, or any other suitable material. The metallic fill material can be deposited by a conformal deposition method, which can be, for example, chemical vapor deposition (CVD), atomic layer deposition (ALD), electroless plating, electroplating, combinations thereof, or any other suitable method. FIG. 22B and FIG. 22C illustrate perspective views of the metal routings 2200 and the top vias 2202 with various components of the 3D memory device test structure 900D. FIG. 22C illustrates a conduction path 2210 formed by using the metal routings 2200 and top vias 2202 to serially connecting the test interconnect structures 1800 to the test bottom interconnect structures 902 and bottom metal routings 904. A first signal (e.g., a voltage signal) may be applied to one end of the 3D memory device test structure 900D (arrow "A" indicated in FIG. 22C), the level of a second signal (e.g., a current signal) detected on the other end of the 3D memory device test structure 900D (arrow "B" indicated in FIG. 22C) can be used to determine whether one or more open circuits are present along the conduction path 2210. For example, if there is an open circuit present along the conduction path 2210, the level of the second signal may be lower than a threshold. The threshold can be pre-calibrated based on various process parameters (e.g., the resistivity of a material of the test interconnect structures 1800, a number of the test interconnect structures 1800, etc.). On the other hand, if there is no open circuit present, the level of the second signal should be equal to or greater than the threshold. The metal routings 2200 provide a different conduction path than the one formed from the metal routings 1900 (FIG. 19) and can therefore test the second interconnect structures of the tested memory block in a different manner.

Figure 23A:
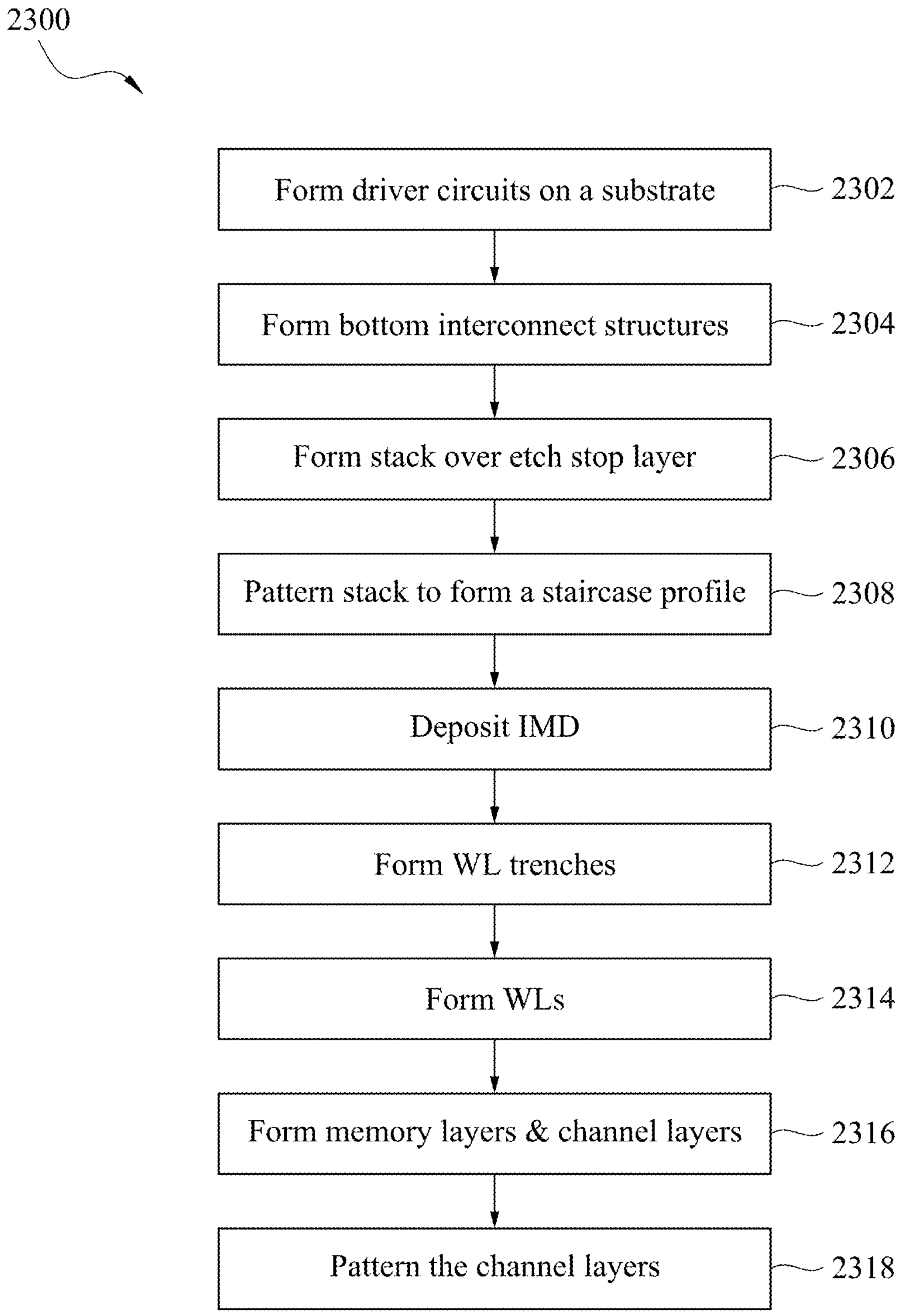
FIGS. 23A-B illustrate a flow chart of an example method to make a three-dimensional memory device, in accordance with some embodiments.
Figure 23B:
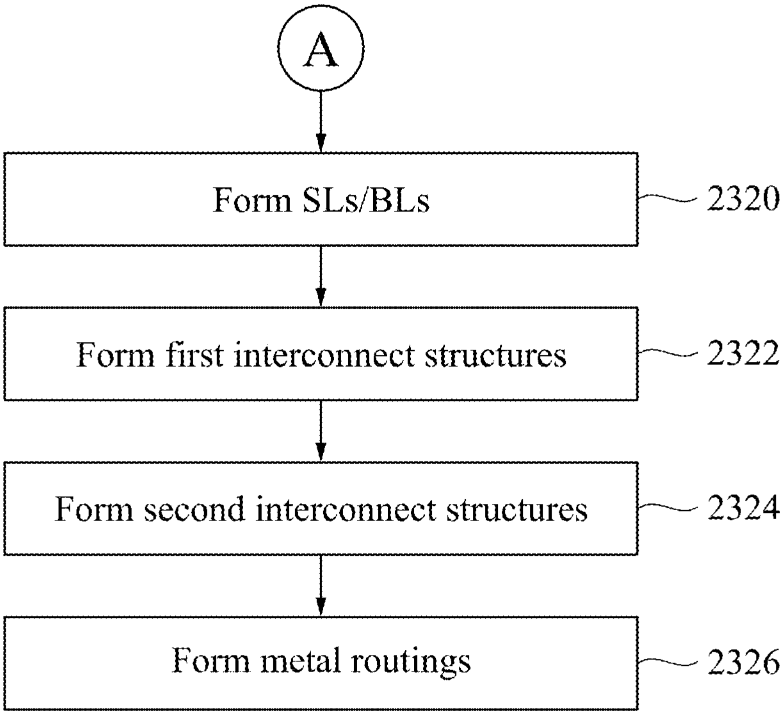

FIGS. 23A-B illustrate a flowchart of a method 2300 to form a 3D memory device, according to one or more embodiments of the present disclosure. For example, at least some of the operations of the method 2300 can be used to form a memory device (e.g., 3D memory device 2400). It is noted that the method 2300 is merely an example, and is not intended to limit the present disclosure. Accordingly, it is understood that additional operations may be provided before, during, and after the method 2300 of FIG. 23, and that some other operations may only be briefly described herein.

In a brief overview, the method 2300 starts with operation 2302 of forming a plurality of driver circuits are formed on a substrate. The method 2300 proceeds to operation 2304 of forming bottom interconnect structures. The method 2300 proceeds to operation 2306 in of forming a stack over an etch stop layer. The method 2300 proceeds to operation 2308 of patterning the stack in a staircase profile. The method 2300 proceeds to operation 2310 of depositing an intermetal dielectric (IMD). The method 2300 proceeds to operation 2312 of forming a number of word line (WL) trenches. The method 2300 proceeds to operation 2314 of forming a number of WLs. The method 2300 proceeds to operation 2316 of depositing a number of memory layers and a number of channel layers. The method 2300 proceeds to operation 2318 of patterning the channel layers. The method 2300 proceeds to operation 2320 of forming a number of (source/select line) SLs and number of bit lines (BLs). The method 2300 proceeds to operation 2322 of forming a number of first interconnect structures (sometimes referred to as WL interconnect structures). The method 2300 proceeds to operation 2324 of forming second interconnect structures. The method 2300 proceeds to operation 2326 of forming a number of metal routings.

Figure 24A:
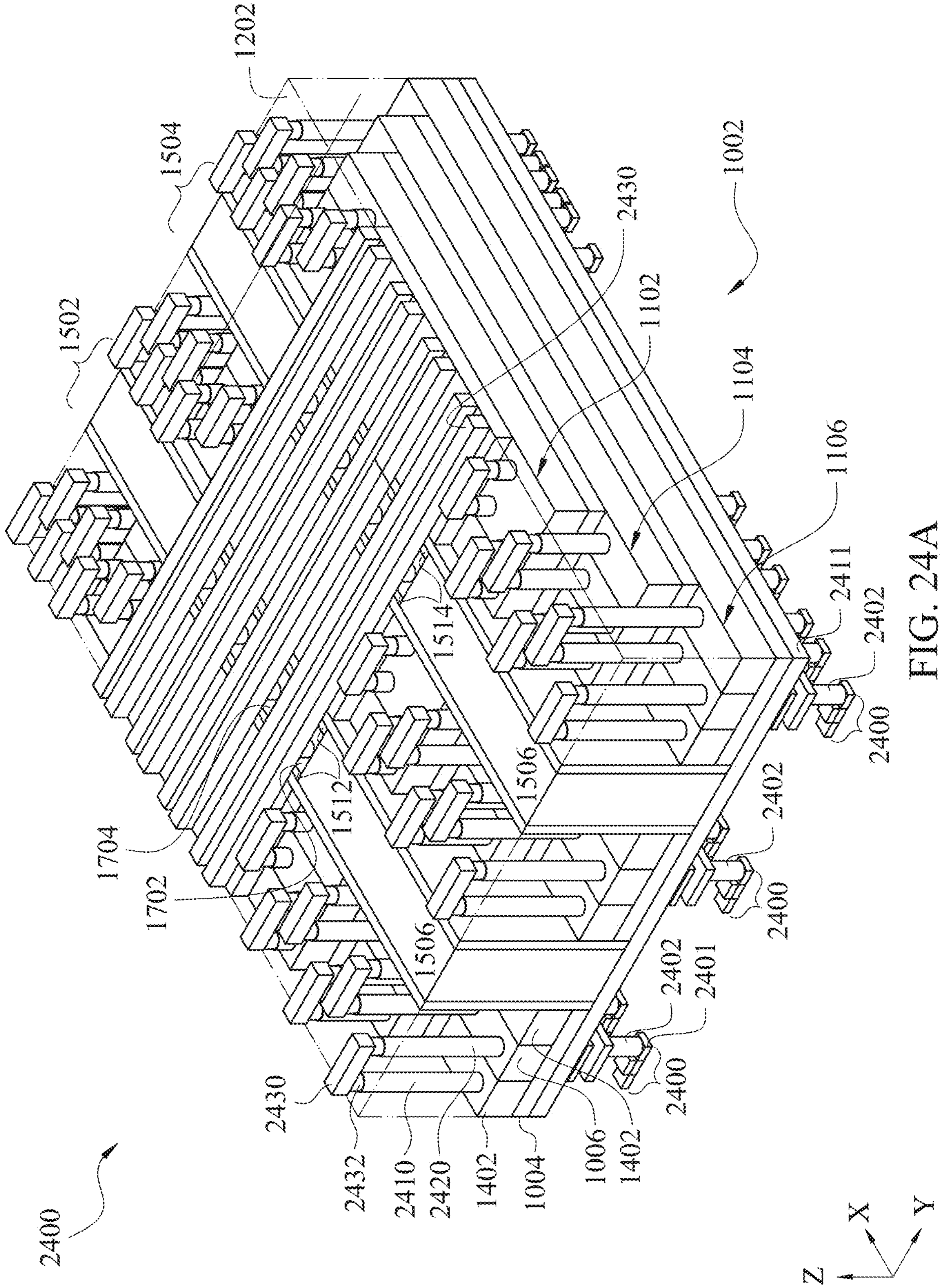
FIGS. 24A-B illustrate a perspective view and a cross-sectional view, respectively, of a three-dimensional memory device, made by the method of FIGS. 23A-B, in accordance with some embodiments.
Figure 24B:
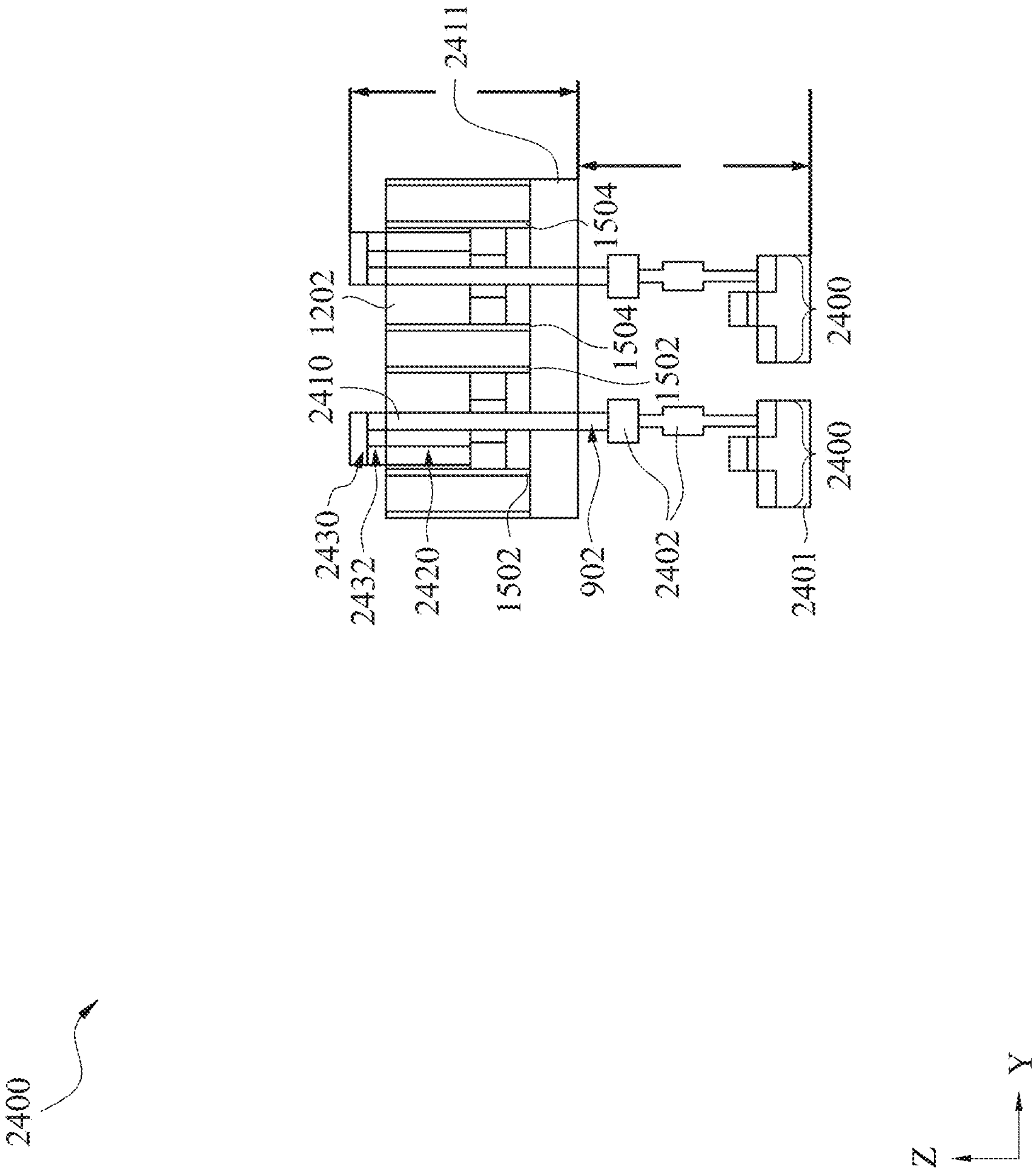

It is noted the operations 2304-2320 and 2324-2326 of FIG. 23 are substantially similar to the operations 802-822 of FIG. 8. Thus, the following discussions will be directed to the operations 2302 and 2322. FIGS. 24A-B each illustrate, in a perspective view and a cross-sectional view, respectively, the 3D memory device 2400 made by the method 2300. The 3D memory device 2400 is substantially similar to the 3D memory device test structure 900, but includes driver circuits and a plurality of first interconnect structures coupled to WLs. In some embodiments, the 3D memory device 2400 is formed concurrently with the 3D memory device test structures 900 in order to be tested by the 3D memory device test structures 900. Although FIGS. 24A-B illustrate the 3D memory device 2400, it is understood the 3D memory device 2400 may include a number of other device such as inductors, fuses, capacitors, coils, etc., which are not shown in FIGS. 24A-B for the purposes of clarity.

In some embodiments, the method 2300 is substantially similar to the method 800 of FIGS. 8A-B except that the method 2300 further includes operations to form a plurality of driver circuits and a plurality of WL interconnect structures. In some embodiments, the method 2300 is used to form a memory block tested by the 3D memory device test structures formed by the method 800. Thus, in the following discussions, operations of the method 2300 may be associated with the perspective view and cross-sectional view of FIGS. 24A-B, respectively.

Corresponding to operations 2302-2326 of FIG. 23, FIGS. 24A-B are a perspective view and a cross-sectional view cut along the Y-direction, respectively, of the 3D memory device 2400, in accordance with various embodiments.

At operation 2302, a plurality of driver circuits 2400 are formed on a semiconductor substrate 2401 (substantially similar to the semiconductor substrate 1001 of FIG. 10). The semiconductor substrate 2401 may be a semiconductor substrate, such as a bulk semiconductor, a semiconductor-on-insulator (SOI) substrate, or the like, which may be doped (e.g., with a p-type or an n-type dopant) or undoped. The substrate 2401 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 2401 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof, or any other suitable material. The plurality of driver circuits 2400 may comprise a plurality of transistors. The transistors may be any suitable transistor such as a complementary metal-oxide semiconductor (CMOS), any other suitable metal-oxide-semiconductor field-effect transistor (MOSFET), any suitable field-effect transistor (FET), or any suitable bipolar junction transistor (BJT). The driver circuits are configured to control the plurality of transistors (e.g., regulate current flow or control components in the memory device).

A plurality of metal structures 2402 may be disposed above and electrically coupled to the driver circuits 2400. Each metal structure 2402 may comprise vertically extending components (vias) and horizontally extending components (interconnect structures). The plurality of metal structures 2402 may be formed from a metallic material including at least one metal material such as, but not limited to, tungsten, copper, cobalt, ruthenium, titanium, tantalum, combinations thereof, or any other suitable material. The plurality of metal structures 2402 can be formed by a conformal deposition method, which can be, for example, chemical vapor deposition (CVD), atomic layer deposition (ALD), electroless plating, electroplating, or a combinations thereof, or any other suitable method. At operation 2304 (and similar to operation 802 of FIG. 8), the plurality of bottom interconnect structures 902 may be formed on plurality of metal structures 2402. The bottom interconnect structures 902 may be configured to electrically couple to the metal structures 2402 and the driver circuits 2400. In some embodiments, one bottom interconnect structure 902 may be formed to couple to one metal structure 2402 and to one driver circuit 2400. The plurality of bottom interconnect structures 902 may be formed concurrently in the memory device 2400 and the memory device test structures 900.

At operation 2306, the stack 1002 is formed over an etch stop layer 2411. The etch stop layer 2411, formed in place of the substrate 1001 in the 3D memory device test structure 900, can function as an etch stop layer in a subsequent etching process, and may comprise a suitable material such as silicon oxide, silicon nitride, silicon oxynitride, titanium, titanium nitride, combinations thereof, or any other suitable material, and may be formed by a suitable formation method such as CVD, PVD, any other suitable method, or combinations thereof. The etch stop layer 2411 is formed directly above bottom interconnect structures 902 and extends in both the X-direction and the Y-direction. The etch stop layer 2411 is substantially planar in both the X-direction and the Y-direction. The etch stop layer 2411 may have a thickness in the Y-direction in a range in between about 5 Angstroms and about 50 Angstroms, inclusive (e.g., 5, 15, 25, 35, 45, and 50 Angstroms) or any other suitable thickness.

At operation 2308 (e.g., similar to operation 806 of FIG. 8), the stack 1002 is patterned to form a staircase profile comprising the first step 1102, the second step 1104, and the third step 1106. At 2310 (e.g., similar to operation 808 of FIG. 8), the IMD 1202 is formed over the stack 1002. At 2312 (e.g., similar to operation 810 of FIG. 8), the number of WL trenches 1302 and 1304 are formed (not shown). At 2314 (e.g., similar to operation 812 of FIG. 8), the WLs 1402 are formed. At 2316 (e.g., similar to operation 814 of FIG. 8), the memory layers 1502, 1504 and the channel layers 1512, 1514 are formed. The inner spacers 1506 are also formed. At 2318 (e.g., similar to operation 816 of FIG. 8), the channel layers 1512, 1514 are patterned. At 2320 (e.g., similar to operation 818 of FIG. 8), the BLs 1702 and the SLs 1704 are formed. Each of the operations 2308-2320 may be formed concurrently with their respective similar operation from the method 800.

At operation 2322, a number of first interconnect structures 2410 (e.g., WL interconnect structures, WL vias) coupled to the WLs 1402 are formed. The first interconnect structures 2410 each penetrate through the IMD 1202 with a respective height (or depth) to land on a respective WL 1402. For example, in FIG. 24A, a number of first interconnect structures 2410 vertically extend with a first height to land on the WLs 1402 at the first step 1102; a number of first interconnect structures 2410 vertically extends with a second height to land on the WLs 1402 at the second step 1104; and a number of first interconnect structures 2410 vertically extends with a third height to land on the WLs 1402 at the third step 1106. The first interconnect structures 2410 are formed by etching the IMD 1202 to form a number of openings that expose various portions of the WLs 1402 at different steps, and then filled out with the openings with a metallic fill material. The metallic fill material includes at least one metal material such as, but not limited to, tungsten, copper, cobalt, ruthenium, titanium, tantalum, combinations thereof, or any other suitable material. The metallic fill material can be deposited by a conformal deposition method, which can be, for example, chemical vapor deposition (CVD), atomic layer deposition (ALD), electroless plating, electroplating, combinations thereof, or any other suitable method. At operation 2324, (e.g., similar to operation 820 of FIG. 8), a number of second interconnect structures 2420 (e.g., similar to the test interconnect structures 1800) are formed. In some embodiments, the number of second interconnect structures 2420 are formed at the same time as the test interconnect structures of operation 1800 of the 3D memory device test structure 900. The second interconnect structures 2420 of the 3D memory device 2400 and the test interconnect structures 1800 of the 3D memory device test structure 900 may be formed concurrently so as to mirror each other's profiles and dimensions. In some embodiments, the first interconnect structures 2410 are formed before the second interconnect structures 2420 and the test interconnect structures 1800.

At operation 2326 (e.g., similar to operation 822 of FIG. 8), a first plurality of metal routings 2430 (similar to the metal routings 1900, 2000, 2100, and 2200) and top vias 2432 (similar to the top vias 1902, 2002, 2102, and 2202) are formed. A second plurality of metal routings 2440 connecting the BLs 1702 and the SLs 1704 are also formed. The second plurality of metal routings may be made from the same materials and methods as the first plurality of metal routings 2430.

In one aspect of the present disclosure, a memory device is disclosed. The memory device includes a first memory block. The first memory block includes a first memory sub-array and a first interface portion disposed next to the first memory sub-array. The first interface portion has a staircase profile. The first memory block further includes a plurality of first interconnect structures electrically coupled to the first memory sub-array through the first interface portion and a second plurality of interconnect structures. Each of the plurality of second interconnect structures is configured to electrically couple a corresponding one of the plurality of first interconnect structures to a transistor. The memory device further includes a first test structure disposed next to the first memory block and configured to simulate electrical connections of the plurality of second interconnect structures. The memory device further includes a second test structure disposed next to the first memory block and configured to simulate electrical connections of the plurality of second interconnect structures. The first and second test structures are electrically coupled to each other and are each electrically isolated form the first memory block.

In another aspect of the present disclosure, a memory device is disclosed. The memory device includes a plurality of memory sub-arrays, wherein each of the memory sub-arrays is accessed through a plurality of word lines (WLs), and wherein each of the plurality of WLs is coupled to a WL driver through a corresponding one of a plurality of interconnect structures. The memory device further comprises a plurality of test structures. Each of the test structures corresponds to one of the memory sub-arrays and comprises a plurality of test interconnect structures that emulate the interconnect structures, respectively. The plurality of test structures are electrically coupled to one another in series.

In yet another aspect of the present disclosure, a method for testing a memory device is disclosed. The method includes forming a plurality of test structures, wherein each of the test structures is physically disposed next to but electrically isolated from a corresponding one of the memory sub-arrays. Each of the test structures is configured to emulate a plurality of interconnect structures that electrically couples the corresponding memory sub-array to a driver circuit. The method further includes coupling the test structures in series and determining whether a level of current conducting through the serially connected test structure satisfies a condition. The method further includes testing, based on the determination, one of the test structures by bypassing the rest of the test structures at a time so as to identify electrical connection issues in one or more of the memory sub-arrays.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a memory block, including:

a memory array;

interface portions extending laterally through the memory array; and first interconnect structures extending vertically through the memory array and electrically coupled to the interface portions;

a first test structure; and a second test structure, the first test structure and the second test structure physically disposed next to the memory block, wherein:

the first test structure includes first test interconnect structures extending vertically;

the second test structure includes second test interconnect structures extending vertically and electrically coupled to the first test interconnect structures in series;

the first test structure and the second test structure are electrically isolated from the memory block; and the first test structure and the second test structure are configured to emulate the memory block.

2. The memory device of claim 1, wherein the memory device further includes a driver circuit disposed underneath the memory block, and wherein the memory block further includes second interconnect structures electrically coupled to the driver circuit.

3. The memory device of claim 1, wherein the first test interconnect structures and the second test interconnect structures each emulate profiles and dimensions of the first interconnect structures.

4. The memory device of claim 1, further comprising conductive structures laterally extending over the memory block, the conductive structures configured to electrically couple the first test structure to the second test structure in series.

5. The memory device of claim 1, wherein:

the first test structure further includes a first test memory array and first test interface portions;

the second test structure further includes a second test memory array and second test interface portions; and the interface portions, the first test interface portions, and the second test interface portions each include a staircase profile.

6. The memory device of claim 5, wherein:

the first test interface portions include a plurality of first test sacrificial layers extending laterally across the first test structure and separated from one another vertically, each one of the first test interconnect structures extending vertically through a corresponding one of the first test sacrificial layers; and the second test interface portions include a plurality of second test sacrificial layers extending laterally across the second test structure and separated from one another vertically, each one of the second test interconnect structures extending vertically through a corresponding one of the second test sacrificial layers.

7. The memory device of claim 5, wherein:

the first test structure further includes a plurality of first bottom interconnect structures and first bottom metal routings both configured to electrically couple the first test interconnect structures to one another in series; and the second test structure further includes a plurality of second bottom interconnect structures and second bottom metal routings both configured to electrically couple the second test interconnect structures to one another in series.

8. A memory device, comprising:

a memory block, including:

a memory array;

interface portions extending laterally through the memory array; and first interconnect structures extending vertically through the memory array and electrically coupled to the interface portions, the first interconnect structures having a first profile; and a first test structure; and a second test structure, the first test structure and the second test structure physically disposed next to the memory block, wherein:

the first test structure includes first test interface portions having a second profile;

the second test structure electrically coupled to the first test structure in series, the second test structure including second test interface portions having a third profile;

the first test structure and the second test structure are electrically isolated from the memory block; and the first profile, the second profile, and the third profile each include a staircase configuration.

9. The memory device of claim 8, wherein:

the first test structure includes first test interconnect structures extending vertically;

the second test structure includes second test interconnect structures extending vertically and electrically coupled to the first test interconnect structures in series; and the first test interconnect structures and the second test interconnect structures each emulate profiles and dimensions of the first interconnect structures.

10. The memory device of claim 9, wherein:

the first test structure further includes a plurality of first bottom interconnect structures and first bottom metal routings both configured to electrically couple the first test interconnect structures to one another in series; and the second test structure further includes a plurality of second bottom interconnect structures and second bottom metal routings both configured to electrically couple the second test interconnect structures to one another in series.

11. The memory device of claim 8, wherein:

the first test interface portions include a plurality of first test sacrificial layers extending laterally across the first test structure and separated from one another vertically, the first test sacrificial layers configured to form the second profile; and the second test interface portions include a plurality of second test sacrificial layers extending laterally across the second test structure and separated from one another vertically, the second test sacrificial layers configured to form the third profile.

12. The memory device of claim 8, further comprising conductive structures laterally extending over the memory block, the conductive structures configured to electrically couple the first test structure to the second test structure in series.

13. The memory device of claim 8, wherein:

the first test structure further includes a first test memory array electrically coupled to the first test interface portions; and the second test structure further includes a second test memory array electrically coupled to the second test interface portions.

14. The memory device of claim 8, wherein the second profile and the third profile each emulate dimensions of the first profile.

15. The memory device of claim 8, wherein the memory device further includes a driver circuit disposed underneath the memory block, and wherein the memory block further includes second interconnect structures electrically coupled to the driver circuit.

16. A memory device, comprising:

a memory block, including:

a memory array;

interface portions extending laterally through the memory array, the interface portions having a first staircase profile; and first interconnect structures extending vertically through the memory array and electrically coupled to the interface portions; and a first test structure; and a second test structure, the first test structure and the second test structure physically disposed next to the memory block, wherein:

the first test structure includes first test interconnect structures extending vertically;

the second test structure includes second test interconnect structures extending vertically and electrically coupled to the first test interconnect structures in series;

the first test structure and the second test structure are electrically isolated from the memory block; and the first test interconnect structures and the second test interconnect structures each emulate profiles and dimensions of the first interconnect structures.

17. The memory device of claim 16, wherein:

the first test structure further includes a first test memory array and first test interface portions, the first test interface portions having a second staircase profile;

the second test structure further includes a second test memory array and second test interface portions, the second test interface portions having a third staircase profile; and the second staircase profile and the third staircase profile each emulate the first staircase profile.

18. The memory device of claim 17, wherein:

the first test interface portions include a plurality of first test sacrificial layers extending laterally across the first test structure and separated from one another vertically, each one of the first test interconnect structures extending vertically through a corresponding one of the first test sacrificial layers; and the second test interface portions include a plurality of second test sacrificial layers extending laterally across the second test structure and separated from one another vertically, each one of the second test interconnect structures extending vertically through a corresponding one of the second test sacrificial layers.

19. The memory device of claim 17, wherein:

the first test structure further includes a plurality of first bottom interconnect structures and first bottom metal routings both configured to electrically couple the first test interconnect structures to one another in series; and the second test structure further includes a plurality of second bottom interconnect structures and second bottom metal routings both configured to electrically couple the second test interconnect structures to one another in series.

20. The memory device of claim 16, wherein the memory device further includes a driver circuit disposed underneath the memory block, and wherein the memory block further includes second interconnect structures electrically coupled to the driver circuit.

* * * * *